United States Patent
Warner et al.

(10) Patent No.: US 9,984,943 B2
(45) Date of Patent: May 29, 2018

(54) SYSTEMS AND METHODS FOR ALIGNING AND COUPLING SEMICONDUCTOR STRUCTURES

(71) Applicant: Massachusetts Institute of Technology, Cambridge, MA (US)

(72) Inventors: Keith Warner, Whitinsville, MA (US); Richard P. D'Onofrio, Norton, MA (US); Donna-Ruth W. Yost, Acton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days. days.

(21) Appl. No.: 15/388,625

(22) Filed: Dec. 22, 2016

(65) Prior Publication Data

US 2017/0330805 A1 Nov. 16, 2017

Related U.S. Application Data

(60) Provisional application No. 62/336,929, filed on May 16, 2016.

(51) Int. Cl.
| | |
|---|---|
| *H01L 21/66* | (2006.01) |
| *H01L 23/00* | (2006.01) |
| *H01L 27/06* | (2006.01) |

(52) U.S. Cl.
CPC ............ *H01L 22/20* (2013.01); *H01L 24/75* (2013.01); *H01L 24/83* (2013.01);
(Continued)

(58) Field of Classification Search
None
See application file for complete search history.

(56) References Cited

U.S. PATENT DOCUMENTS

| | | |
|---|---|---|
| 4,469,949 A | 9/1984 | Mori et al. |
| 4,825,086 A | 4/1989 | Mueller |
| | (Continued) | |

FOREIGN PATENT DOCUMENTS

| | | |
|---|---|---|
| WO | WO 2015/136898 A1 | 9/2015 |
| WO | WO 2016/025478 A1 | 2/2016 |

OTHER PUBLICATIONS

Aull, et al.; "Laser Radar Imager Based on 3D Integration of Geiger-Mode Avalanche Photodiodes with Two SOI Timing Circuit Layers;" 2006 IEEE International Solid-State Conference; Feb. 6-9, 2006; 10 Pages.
(Continued)

*Primary Examiner* — Asok K Sarkar
(74) *Attorney, Agent, or Firm* — Daly, Crowley, Mofford & Durkee, LLP

(57) ABSTRACT

In a system for aligning at least two semiconductor structures for coupling, an alignment device includes a mounting structure having at least first and second opposing portions. The alignment device also includes a first mounting portion movably coupled to the first portion of the mounting structure, the first mounting portion configured to couple to a first surface of a first semiconductor structure. The alignment device additionally includes a second mounting portion movably coupled to the second portion of the mounting structure, the second mounting portion configured to couple to a second surface of a second semiconductor structure. The alignment device further includes one or more imaging devices disposed above at least one of the first and second mounting portions of the alignment device, the imaging devices configured to capture and/or or detect alignment marks in at least the first semiconductor structure. A corresponding method for aligning two or more semiconductor structures for coupling is also provided.

15 Claims, 16 Drawing Sheets

(52) U.S. Cl.
CPC *H01L 27/0688* (2013.01); *H01L 2224/75753* (2013.01); *H01L 2224/8313* (2013.01)

(56) References Cited

U.S. PATENT DOCUMENTS

| | | | |
|---|---|---|---|
| 5,113,565 A | 5/1992 | Cipolla et al. | |
| 6,342,705 B1 | 1/2002 | Li et al. | |
| 2003/0168615 A1 | 9/2003 | Loopstra et al. | |
| 2015/0364444 A1* | 12/2015 | Scanlan | H01L 21/76879 438/5 |

OTHER PUBLICATIONS

Burns, et al.; "A Wafer-Scale 3-D Circuit Integration Technology;" IEEE Transactions on Electron Devices; vol. 53; No. 10; pp. 2507-2516; Oct. 2006; 10 Pages.

Chen, et al.; "Wafer-Scale 3D Integration of InGaAs Image Sensors with Si Readout Circuits;" 2009. 3DIC 2009. IEEE International Conference on 3D System Integration; Sep. 28-30, 2009; 4 Pages.

Suntharalingam, et al.; "A 4-Side Tileable Back Illuminated 3D-Integrated Mpixel CMOS Image Sensor," IEEE International Solid-State Circuits Conference—Digest of Technical Papers, 2009; Feb. 8-12, 2016; 4 Pages.

Suntharalingam, et al.; "Megapixel CMOS Image Sensor Fabricated in Three-Dimensional Integrated Circuit Technology;" 2005 IEEE International Solid-State Circuits Conference, 2005; Digest of Technical Papers; Feb. 8, 2005; 35 Pages.

PCT Search Report of the ISA for PCT Appl. No. PCT/US2014/024269 dated Jun. 5, 2017; 3 pages.

PCT Written Opinion of the ISA for PCT Appl. No. PCT/US2017/024269 dated Jun. 5, 2017; 9 pages.

\* cited by examiner

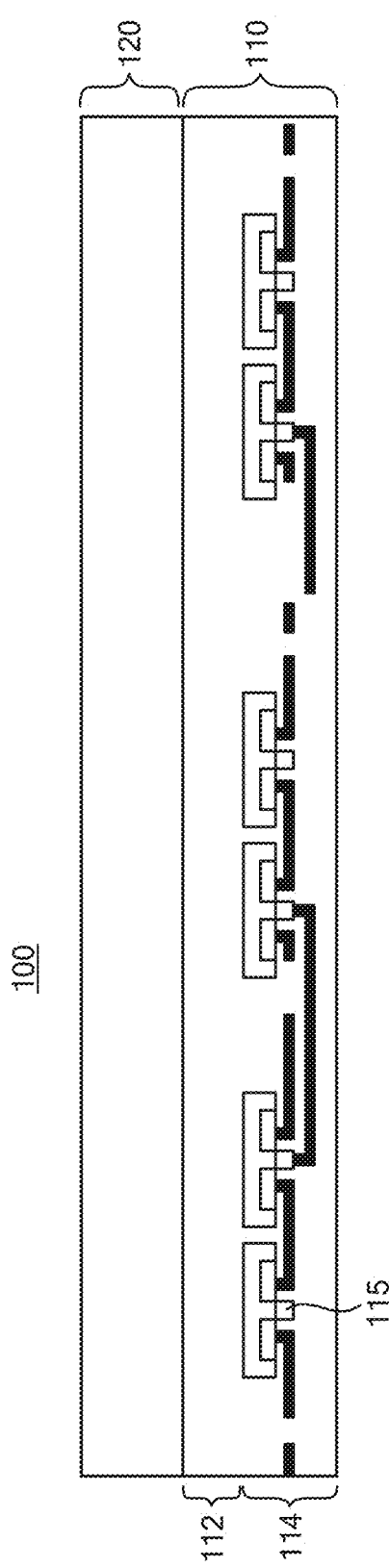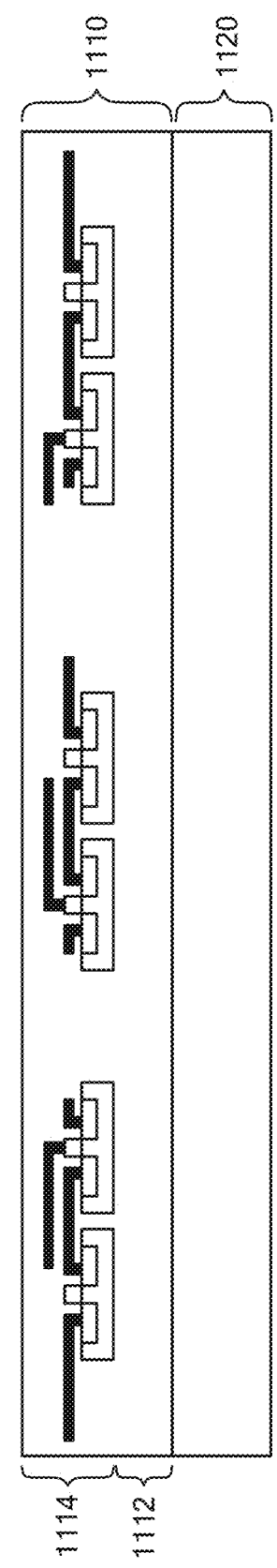

SYSTEMS AND METHODS FOR ALIGNING AND COUPLING SEMICONDUCTOR STRUCTURES

CROSS REFERENCE TO RELATED APPLICATION

The present application claims the benefit of U.S. Provisional Application 62/336,929, titled "SYSTEMS AND METHODS FOR ALIGNING AND COUPLING SEMICONDUCTOR STRUCTURES," filed on May 16, 2016. The entire disclosure of which is hereby incorporated herein by reference in its entirety.

GOVERNMENT RIGHTS

This invention was made with government support under Contract No. FA8721-05-C-0002 awarded by the U.S. Air Force. The government has certain rights in the invention.

FIELD

This disclosure relates generally to semiconductor structures, and, more particularly, to systems and methods for aligning and coupling semiconductor structures to form multi-layer semiconductor structures and devices.

BACKGROUND

As is known in the art, the performance and complexity of semiconductor structures and devices has drastically increased over the past several decades and will likely continue to increase. Additionally, the circuit density of semiconductor structures and devices has increased, resulting in more circuitry in a given space. By employing clever techniques and new materials, however, the semiconductor industry has managed to overcome some of the physical barriers that had been predicted to occur (e.g., via Moore's Law), allowing for the continued progression (and miniaturization) of semiconductor structures and devices. One such technique that has generated interest in recent times is the stacking (e.g., vertical stacking) and bonding (e.g., electrical coupling) of individual semiconductor structures to form multi-layer semiconductor structures, which are commonly referred to as three-dimensional (3-D) integrated circuits (ICs). One such multi-layer semiconductor structure is described in U.S. Pat. No. 7,067,909 entitled "Multi-layer integrated semiconductor structure having an electrical shielding portion," which is assigned to the assignee of the present disclosure and incorporated herein by reference in its entirety.

In fabricating multi-layer semiconductor structures, such as that which is described in the above-referenced U.S. Pat. No. 7,067,909, for example, the individual semiconductor structures forming the multi-layer semiconductor structures are typically positioned and aligned with respect to each other and then placed in a contact relationship prior to bonding to ensure precise alignment of the semiconductor structures when bonded and stacked. The individual semiconductor structures are then bonded form the multi-layer semiconductor structure. The ability to precisely position, align and bond these individual semiconductor structures can have a significant impact on achievable circuit density of the multi-layer semiconductor structure. For example, the accuracy with which with individual semiconductor structures can be aligned determines, at least in part, the number of semiconductor structures which may be stacked to form a multi-layer semiconductor structure.

SUMMARY

Described herein are concepts, systems, circuits and techniques related to a semiconductor structure alignment device suitable for aligning two or more semiconductor structures to form a multi-layer semiconductor structure (e.g., by bonding together the two or more semiconductor structures). The present disclosure further describes circuits and techniques for fabricating multi-layer semiconductor structures (e.g., 3-D ICs) and devices including at least two semiconductor structures using the semiconductor alignment device. The described circuits and techniques can be used to provide multi-layer semiconductor structures and devices having increased circuit density in comparison to conventional semiconductor structures and devices (e.g., due to increased alignment and coupling accuracy provided by the semiconductor structure alignment device).

In one aspect of the concepts described herein, in a system for aligning at least two semiconductor structures an alignment device includes a semiconductor mounting structure having first and second opposing portions each of which are suitable for receiving and securing respective ones of first and second semiconductor structures. The semiconductor mounting structures are movable with respect to each other.

The alignment device further includes one or more imaging devices disposed above at least one of the first and second opposing portions of the semiconductor mounting structure and configured to capture and/or or detect alignment marks in at least one of the semiconductor structures.

The alignment device may include one or more of the following features individually or in combination with other features.

At least one of the first and second opposing portions of the semiconductor mounting structure may include a vacuum/pressure device disposed to secure a semiconductor portion to one of the first and second opposing portions In one embodiment, the vacuum/pressure device comprises a series of vacuum sections for coupling to semiconductor structures. In one embodiment, the vacuum sections are provided as concentric vacuum rings.

In embodiments, the imaging devices may be provided as a pair of imaging devices. The imaging devices may be provided as infrared (IR) imaging devices. At least one imaging device of the imaging devices may be configured to provide data used to determine a best-fit plane of at least one surface of the first semiconductor structure. The at least one imaging device may be provided as a capacitive sensor, a laser profilometer or an IR sensor.

The alignment device may further include a processor coupled to an output of the imaging devices. The processor may be configured to receive alignment mark images captured by the imaging devices, and in response thereto determine an alignment error between surfaces of the first and second semiconductor structures. The alignment device may include at least one frame grabber having an input coupled to an output of the imaging devices and an output coupled to an input of the processor. The at least one frame grabber may be configured to receive the alignment mark images captured by the imaging devices, and in response thereto provide select ones of the alignment marked images to the output thereof.

In one aspect of the concepts described herein, a method for aligning two or more semiconductor structures for to form a multi-layer semiconductor structure includes mounting or otherwise securing semiconductor structures to a semiconductor mounting structure of an alignment device and capturing, via an imaging device, alignment marks on the semiconductor structures. The semiconductor structures are then planarized and facing surfaces of two semiconductor structures are brought into physical proximity and alignment measurements are made. The semiconductor structures are then brought out of physical proximity. An alignment error value generated based upon the alignment measurements made when the semiconductor structures were in physical proximity. This process of moving semiconductor structures into and out of physical proximity and making alignment measurements to generate alignment error values may be repeated until the alignment error value is below a desired threshold value.

Once an acceptable alignment error value is achieved, the semiconductor structures are bonded or otherwise secured together. Remaining processes may be performed to form a multi-layer semiconductor structure may then be performed.

In one embodiment, bringing semiconductor structures into physical proximity includes operating an alignment device to rapidly move or otherwise place facing surfaces of semiconductor structures proximate each other (e.g. within a first predetermined distance of each other) without causing or allowing the facing semiconductor surfaces to bond to each other (e.g. via an adhesion bond) and then rapidly spacing apart the facing semiconductor surfaces.

The first predetermined distanced may be based upon knowledge of a position of one or more alignment marks of the first one of the semiconductor structures relative to one or more alignment marks of the second one of the semiconductor structures.

In one embodiment, making alignment measurements may include capturing, at a first time, one or more alignment marks in one or more layers of at least the first one of the semiconductor structures with the imaging devices.

Capturing one or more alignment marks in one or more layers of at least the first one of the semiconductor structures may include capturing one or more alignment marks in one or more layers of multiple semiconductor structures.

Capturing one or more alignment marks in one or more layers of semiconductor structures may include capturing one or more alignment marks in one or more layers of a first semiconductor structure, and capturing corresponding alignment marks in one or more layers of a second semiconductor structure.

In embodiments, planarizing the semiconductor structures may include determining a best-fit plane of at least one surface of the semiconductor structures. In embodiments, the method may also include determining a best-fit plane of two opposing surfaces of at least one semiconductor structure. In embodiments, the method may additionally include comparing the best-fit planes of the semiconductor structures to determine tilt and tip errors of facing surfaces of the semiconductor structures.

In embodiments, the method may also include one or more of the following features either individually or in combination with other features. The method may include positioning facing surfaces of semiconductor structures substantially parallel to each other.

In embodiments, the method may also include operating an alignment device to decrease a distance between facing surfaces of semiconductor structures (so as to place the surfaces within close proximity of each other) and capturing images of the one or more alignment marks of at least the first one of the semiconductor structures with imaging devices and then increasing the distance between facing surfaces of semiconductor structures to avoid premature or unintentional bonding of the surfaces.

The method may also include one or more of the following features either individually or in combination with other features. The method may include annealing the bonded semiconductor structure at a predetermined temperature. The method may also include forming electrical interconnections between the first and second semiconductor structures of the bonded semiconductor structure. Forming electrical interconnections between the first and second semiconductor structures of the bonded semiconductor structure may include forming electrical interconnections between the first and second semiconductor structures of the bonded semiconductor structure using complementary metal-oxide semiconductor (CMOS) lithography, plasma etching, and/or via filling processes.

BRIEF DESCRIPTION OF THE DRAWINGS

Features and advantages of the concepts, systems, circuits and techniques disclosed herein will be apparent from the following description of the embodiments taken in conjunction with the accompanying drawings in which.

DETAILED DESCRIPTION

Figure 1B:
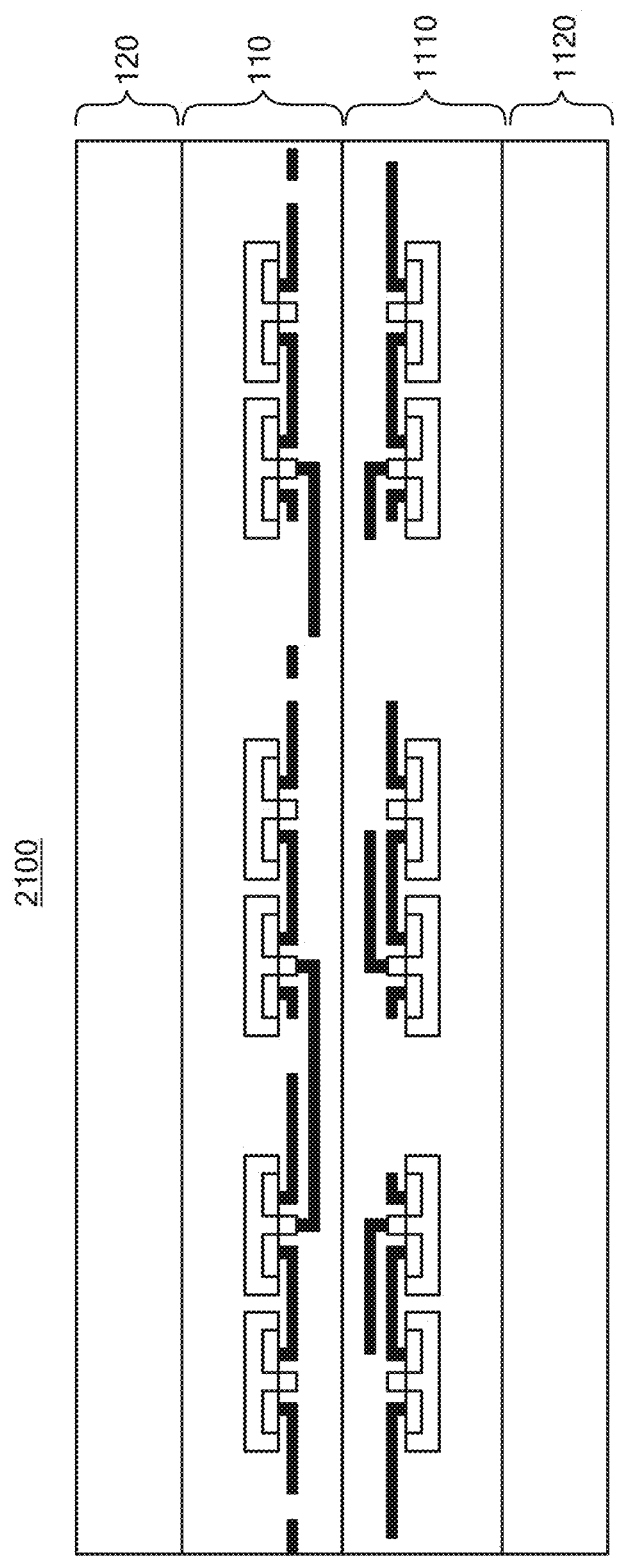
FIGS. 1-1E are block diagrams of example semiconductor structures as may be fabricated using the example alignment device of FIG. 5 or 6, for example.

The features and other details of the concepts, systems, and techniques sought to be protected herein will now be more particularly described. It will be understood that any specific embodiments described herein are shown by way of illustration and not as limitations of the disclosure and the broad concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views.

It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "device layer" is used to describe a single or multilayer structure including a number of active or passive semiconductor components, the structure capable of performing at least part of the functional operations (i.e., semiconductor system performance) of a semiconductor structure. Device layers are typically fabricated separately on Silicon on insulator (SOI) substrates or bulk Silicon (Si) substrates. Additionally, each device layer may include at least one interconnect and one or more of active Si, Gallium nitride (GaN) and III-V field-effect transistors (FETs).

As used herein, the term "electronic device" is used to describe an integrated circuit (IC) device (e.g., a semiconductor chip).

As used herein, the term "interposer" is used to describe an interconnect structure capable of electrically coupling two or more semiconductor structures together.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit or digital circuit.

As used herein, the term "substrate" is used to describe any structure upon which an integrated circuit or semiconductor device can be disposed or upon which semiconductor materials can be deposited and/or into which semiconductor materials can be implanted and diffused to form a semiconductor structure or device, for example. In some embodiments, the substrate may be provided as a P-type substrate (i.e., a substrate) having a particular range of concentrations of P-type atoms (i.e., ions). In other embodiments an N-type substrate may be used (i.e., a substrate having a particular range of concentration of N-type atoms).

The substrate may, for example, be provided from a semiconductor material, an insulator material or even a conductor material. For example, the substrate may be provided from silicon, alumina, glass or any other semiconductor material. Further, the substrate can include a number of metal-oxide-silicon (MOS) devices, complementary-MOS (CMOS) devices, or a number of active or passive integrated circuit semiconductor devices.

As used herein, the terms "vacuum/pressure device" and "suction device" are used to describe a coupling structure (electrical, mechanical, electro-mechanical, or otherwise) for coupling or holding select a surface or portion of a semiconductor structure to a select portion (e.g., a first or second mounting portion) of a semiconductor alignment device.

As used herein, the term "three-dimensional (3-D) integrated circuit (IC)" is used to describe a semiconductor structure including at least two device layers (e.g., which are vertically stacked) and interconnects (e.g., vertical interconnects) to make one or more electrical connections between the device layers.

As used herein, the term "through oxide via (TOV)" is used to describe a via (e.g., micro via) in a semiconductor structure used to connect adjacent device layers. The TOV passes through one or more oxide, dielectric, and/or metal layers and terminates at a predetermined Silicon (Si) layer or surface.

As used herein, the term "via before bond" (also sometimes referred to herein as "via first") is used to describe a micro via and/or a submicro via used to make at least one electrical connection between a first device layer and second device layer in a semiconductor structure including at least two device layers. Additionally, as described here, the term "via first" may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via before bond process, the first device layer and the second device layer are fabricated separately. As one example, a partial via material may be added on first and/or second opposing surfaces (i.e., top and/or bottom surfaces) of the first and second device layers and a subsequent bonding and/or post bonding process may be used to create a via before bond between the first and second device layers.

The via before bond may be filled with at least one metal or alloy having a high Coefficient of Thermal Expansion (CTE) to produce a rigid, robust, and conductive via before bond joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via before bond may be filled with a low temperature fusible metal which melts and interdiffuse during bonding or post bonding processes.

As used herein, the term "via after bond" (also sometimes referred to herein as "via last") is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via after bond process. A pad layer which includes one or more interconnect pads may be added after a via after bond process. In one embodiment, the via after bond is substantially filled. Additionally, in one embodiment, the via after bond can be unfilled or partially filled. The via after bond may pass through the device layers (e.g., second device layers) and, in some embodiments, one or more isolation layers or materials. A titanium (Ti) material having a thickness of about ten nanometers (nm) and, a metal organic chemical vapor deposition (MOCVD) Titanium Nitride (TiN) liner having a thickness of about five nm, and tungsten plugs may be used for via after bond. A MOCVD or chemical vapor deposition (CVD) TiN$_X$, with X less than or equal to 1, is preferred for better conformal coating.

While multi-layer semiconductor structures and devices including a select number of semiconductor structures (e.g., one, two or three semiconductor structures) are described in several examples below, the select number of semiconductor structures are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using more than or less than the select number of semiconductor structures.

Additionally, while semiconductor structures including a select number of semiconductor structure sections (e.g., one, two or three sections) are described in several examples below, the select number of sections (or tiers) are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using more than or less than the select number of sections.

Further, while semiconductor structures including semiconductor structure sections which are the same as or similar to each other are described in several examples below, such are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using semiconductor structure sections which are different from each other.

It should also be appreciated that, as used herein, relational terms, such as "first," "second," "top," "bottom," "left," "right," and the like, may be used to distinguish one element or portion(s) of an element from another element or portion(s) of the element without necessarily requiring or implying any physical or logical relationship or order between such elements.

Referring now to FIG. 1, an example semiconductor structure 100 (e.g., a wafer or die) includes a semiconductor structure section 110 (e.g., a tier-1 functional section) and an optional support or "handle" structure 120. Semiconductor structure section 110 includes an insulating layer 112 and a device layer 114. The insulating layer 112, which is provided from one or more electrically-insulating materials (e.g., etch-stoppable oxide materials such as Silicon Oxide (SiO$_x$)), has first and second opposing surfaces with the first surface corresponding to the first surface of section 110. Semiconductor structure section 110 (also sometimes referred to herein as "section 110") may be fabricated using either Silicon-On-Insulator (SOI) or bulk complementary metal-oxide semiconductor (CMOS) fabrication techniques, for example.

Semiconductor structure 100 may, for example, be provided as part of a multi-layer semiconductor structure (e.g., a three-dimensional (3D) integrated circuit (IC)) fabricated in accordance techniques described herein for aligning and bonding or otherwise securing at least two semiconductor structures (e.g., semiconductor structure 100 and semiconductor structure 1100) to provide a multilayer semiconductor structure.

Device layer 114 may be provided from materials including Silicon (Si), Polysilicon, Graphene, Gallium arsenide (GaAs), Gallium nitride (GaN) and Cobalt Silicide (Co-Silicide) as a few examples. A first surface of device payer 14 is disposed over a surface of the insulating layer and a second, opposing surface of device layer 114 corresponds to the second surface of section 110. The device layer 114 also has a plurality of electrical connections (e.g., provide by conductive vias) extending between the first and second surfaces of the device layer 114. The electrical connections may, for example, be made by drilling holes through the device layer 114 in appropriate locations and plating the inside of the holes with a conductive material (e.g., Copper (Cu) or a Titanium (Ti)/Titanium nitride (TiN) liner with Tungsten (W) fill).

The device layer 114 may also include one or more circuit components, devices and modules (e.g., 115), each of which may be passive or active, for example, disposed between the first and second surfaces of the device layer 114. The circuit components, device, and modules (e.g., resistors, capacitors, transistors, inductors, and/or integrated circuits) may be electrically coupled to select ones of the electrical connections in the device layer 114 (e.g., through one or more conductive structures, as will be discussed). The device layer 114 can be constructed and arranged to operate using electronic components, such as digital signal processors (DSPs) and memories, as well as a number of other digital and/or analog based devices. In addition, the device layer 114 can be constructed and arranged to operate using optical components, such as optical cross-point switches and optical-to-electronic converters, as well as a number of other optical based devices. Furthermore, the device layer 114 can be constructed and arranged to operate using micro-electromechanical (MEM) components, such as micro-motors, sensors and actuators, as well as a number of other MEM based devices.

Handle structure 120 (e.g., a handle substrate) may be provided from materials including, but not limited to Si, Silicon carbide (SiC) and/or Sapphire. Handle structure 120 may be used for mounting or otherwise securing semiconductor structure 100 to machinery (e.g., an alignment device 500, as will be discussed further below) for aligning and bonding or otherwise securing or attaching the semiconductor structure 100 to one or more other semiconductor structures (e.g., semiconductor structure 1100, as will be discussed).

In the example embodiment shown, a surface of the handle structure 120 is disposed over and coupled to a first surface of section 110. In some embodiments, the handle structure 120 may be provided as part of or separate from section 110.

Semiconductor structure 100 may include one or more alignment marks (e.g., fiducial marks) (not shown) which may be provided on one or more layers or portions (e.g., device layer 114) of the semiconductor structure 100. The alignment marks may have a diameter of less than about one hundred micrometers (μm) and be used by alignment devices (e.g., alignment device 500, as will be discussed) in a system for aligning two or more semiconductor structures (e.g., 100 and 1100, shown in FIGS. 1 and 1A) for bonding, as will be discussed. Such alignment marks may be selectively etched or deposited on select layers or portions of the semiconductor structure 100.

As one example, the alignment marks may be provided on a device (or metal) layer (e.g., 114) which is proximate to a select surface (e.g., a second surface) of the semiconductor structure 100. In one embodiment, semiconductor structure 100 includes at least one "global" alignment mark which is used to locate a position of a surface of the semiconductor structure 100, and at least one "local" alignment mark which is used to locate a position of a specific component (e.g., a component in device layer 114) of the semiconductor structure 100. Design, layout and fabrication of alignment marks are conventional in the art and, therefore, are not described in detail here.

Referring now to FIG. 1A, another example semiconductor structure 1100, which may be provided as part of a multi-layer semiconductor structure including at least two semiconductor structures, includes a section 1110 (e.g., a tier-2 functional section) and a handle structure 1120, each having first and second opposing surfaces.

Section 1110 includes at least one insulating layer 1112 and at least one device layer 1114 which can be similarly constructed and arranged to operate as the insulating layer 112 and the device layer 114 of semiconductor structure 100, as described above. In one embodiment, the device layer 1114 and the device layer 114 can each be constructed and arranged to operate using similar components and/or devices, as described above. In another embodiment, the device 1114 layer and the device layer 114 can each be constructed and arranged to operate using dissimilar components and/or devices (e.g., as may be suitable in fabricating a unitary mixed signal multi-layer semiconductor structure which includes semiconductor structure 100 and semiconductor structure 1100).

In the illustrated embodiment, the first surface of handle structure 1120 corresponds to a first surface of the second semiconductor structure 1100 and the second surface of section 1110 corresponds to a second, opposing surface of semiconductor structure 1100. In one embodiment, section 1110 has a buried oxide (BOX) layer, with a first surface of the BOX layer corresponding to the first surface of section 1110.

It should be appreciated that semiconductor structure 1100 may be the same as or similar to semiconductor structure 100 of FIG. 1 and may be fabricated using same or similar techniques as semiconductor structure 100.

Referring now to FIG. 1B, an example multi-layer semiconductor structure 2100 (i.e., a unitary multi-layer semiconductor structure) includes semiconductor structure 100 and semiconductor structure 1100 of FIGS. 1 and 1A, respectively. Multi-layer semiconductor structure 2100 may be fabricated in accordance with the aligning and bonding techniques described herein.

To provide semiconductor structure 2100 a surface of semiconductor structure 100 is disposed over and coupled to (e.g. bonded or otherwise attached or secured) a surface of semiconductor structure 1100 (e.g., using wafer-to-wafer alignment and bonding techniques, as will be discussed). Semiconductor structure 2100 includes sections 110 and 1110 (e.g., tier-1 and tier-2 functional sections, respectively), with section 110 provided from semiconductor structure 100 and section 1110 provided from semiconductor structure 1100. The first surface of semiconductor structure 100 corresponds to the first surface of semiconductor structure 2100, and the first surface of semiconductor structure 1100 corresponds to the second surface of semiconductor structure 2100.

Figure 5:
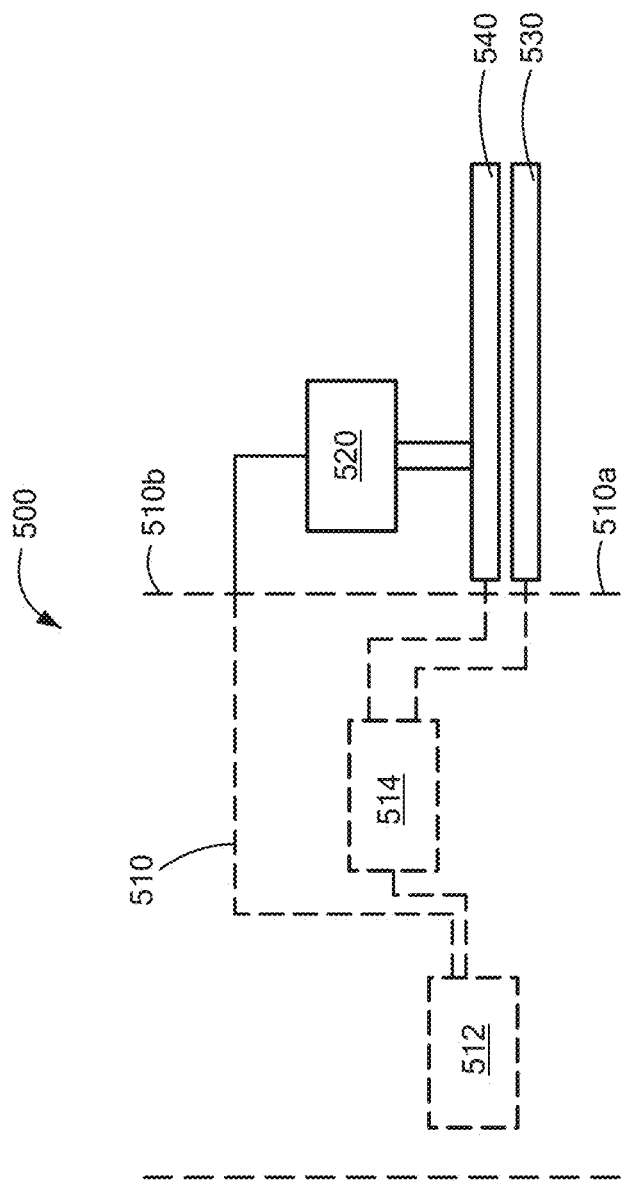
FIG. 5 is a block diagram of an example alignment device as may be provided in a system for aligning at least two semiconductor structures for coupling.
Figure 6:
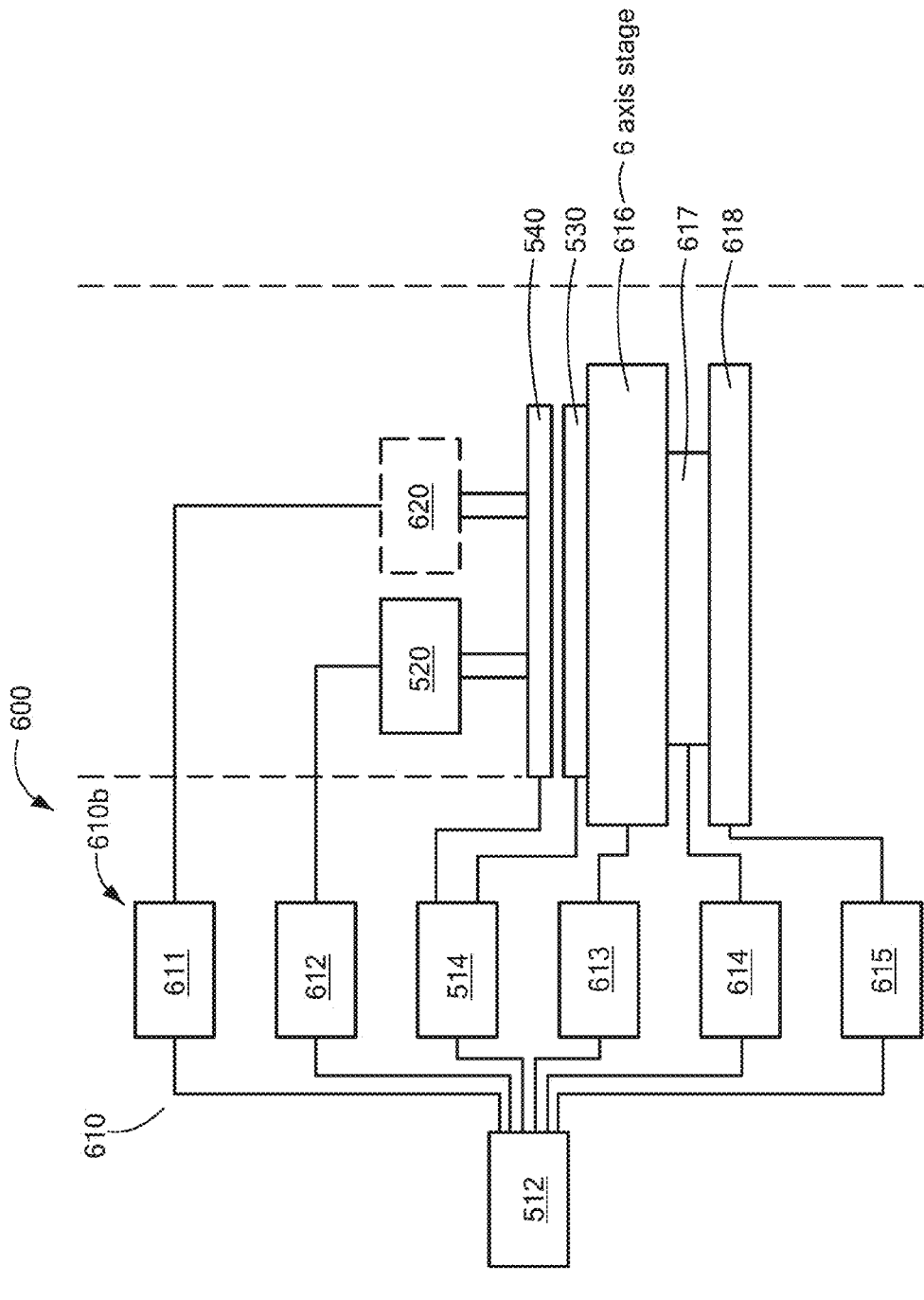
FIG. 6 is a block diagram of another example alignment device as may be provide in a system for aligning at least two semiconductor structures for coupling.
Figure 7:
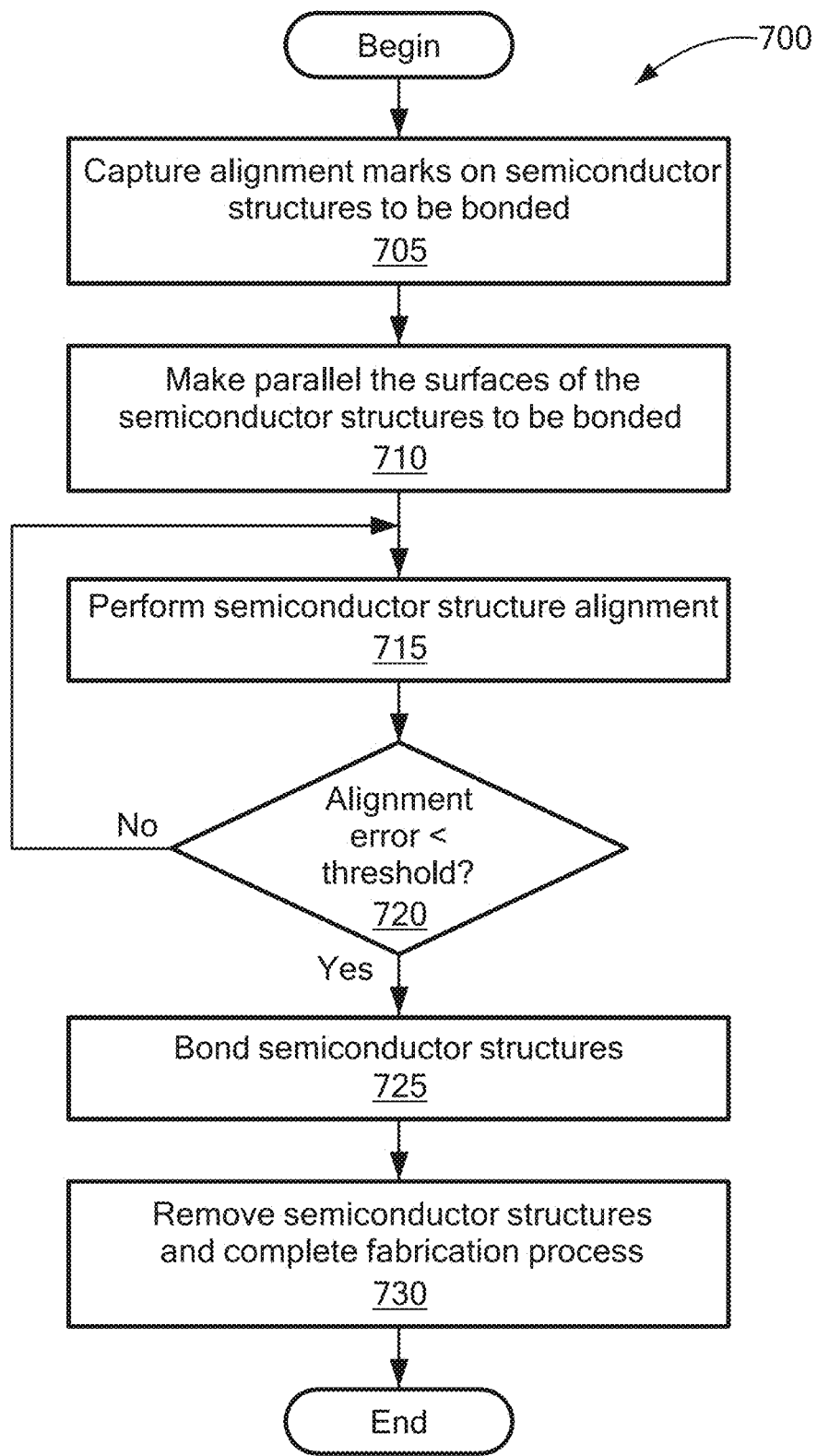
FIG. 7 is a flow diagram illustrating a method for aligning two or more semiconductor structures.

One illustrative apparatus and technique for bonding semiconductor structure 100 to semiconductor structure 1100 are described herein at least in conjunction with FIGS. 5-7.

Each of semiconductor structures 100, 1100 may include a film (e.g., a silicon dioxide film, not shown) which is disposed over the second surface of each semiconductor structure 100, 1100. The film, which may be provided as an interface film or layer, for example, may be polished to a predetermined surface roughness (e.g., a surface roughness of less than about 0.5 root mean square (RMS)) such that when the second surfaces of each of semiconductor structures 100, 1100 are brought in contact with each other, they stick together due to a hydrogen dipole attraction occurring at one or more portions (e.g., conductive interface portions) of the surfaces. Upon heating the surfaces at a predetermined temperature, covalent bonds may be formed at the surfaces such that the bond (e.g., a wafer-to-wafer bond) between the second surfaces of each of semiconductor structures 100, 1100 is sufficiently strengthened.

In the illustrated embodiment, the second surface of each of semiconductor structure 100 and 1100 (i.e. the surfaces facing each other, also referred to herein as the "facing surfaces") may be provided having a same or similar shape (or complimentary shapes) and same or similar dimensions. However, it should be appreciated that in other embodiments, the second surface of semiconductor structure 100 may have a first shape (e.g., rectangular shape) and first dimensions, while the second surface of semiconductor structure 1100 may have a second, different shape (e.g., square or circular shape) and second, different dimensions. Thus, in accordance with embodiments of the concepts described herein, semiconductor structure 100 and 1100 can be coupled together regardless of their respective sizes, shapes or geometries to form a multi-layer semiconductor structure (e.g., semiconductor structure 2100).

Similar to semiconductor structure 100, semiconductor structure 1100 may include one or more alignment marks which may be provided on one or more layers or portions (e.g., device layer 1114) of the semiconductor structure 1100. The alignment marks may, for example, be used for aligning semiconductor structure 1100 (e.g., a second semiconductor structure) relative to semiconductor structure 100 (e.g., a first semiconductor structure) for coupling.

Figure 1C:
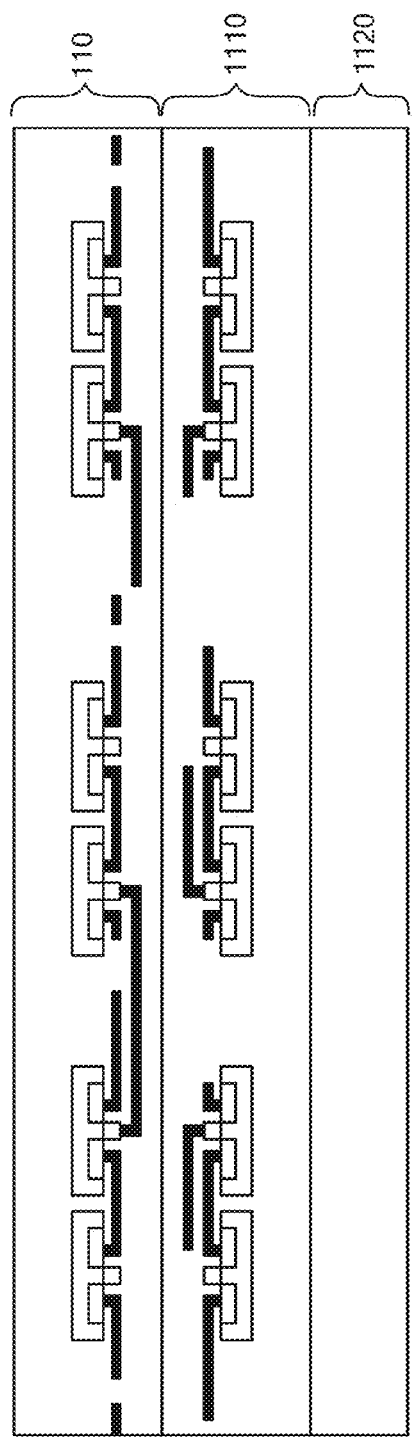

Referring now to FIG. 1C, an example multi-layer semiconductor structure 2100' similar to semiconductor structure 2100 of FIG. 1B is shown. Here, however, the semiconductor structure 2100' does not include handle structure 120. The handle structure 120 is removed (or decoupled) from semiconductor structure 2100 using techniques well known to those of ordinary skill in the art (e.g., using a combination of grinding and wet chemical etching). In one embodiment, the handle structure 120 is removed such that the first surface of section 110 (e.g., first surface of buried oxide (BOX) layer) is substantially exposed.

Figure 1D:
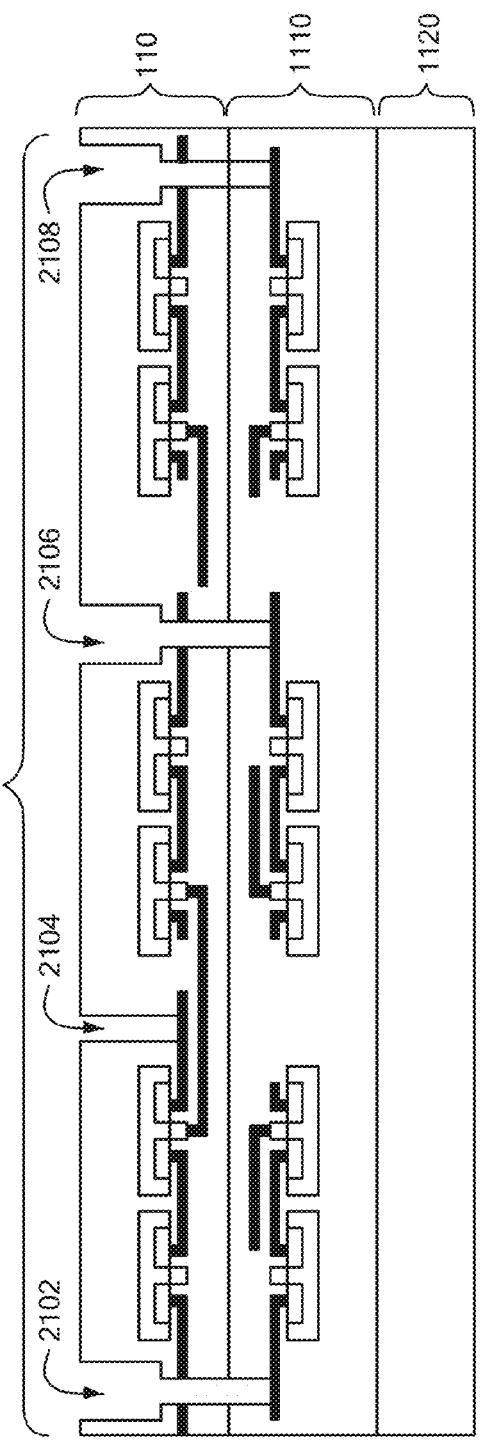

Referring now to FIG. 1D, a plurality of openings 2102, 2104, 2106 and 2108 are formed (e.g., through grinding and/or etching processes) in select portions of the semiconductor structure 2100'. In the illustrated embodiment, openings 2102, 2106 and 2108 extend between the second surface of semiconductor structure 2100' and select ones of the electrical connections in each of section 1110 and section 110. Additionally, opening 2104 extends between the second surface of semiconductor structure 2100' and select ones of the electrical connections in section 1110.

Figure 1E:
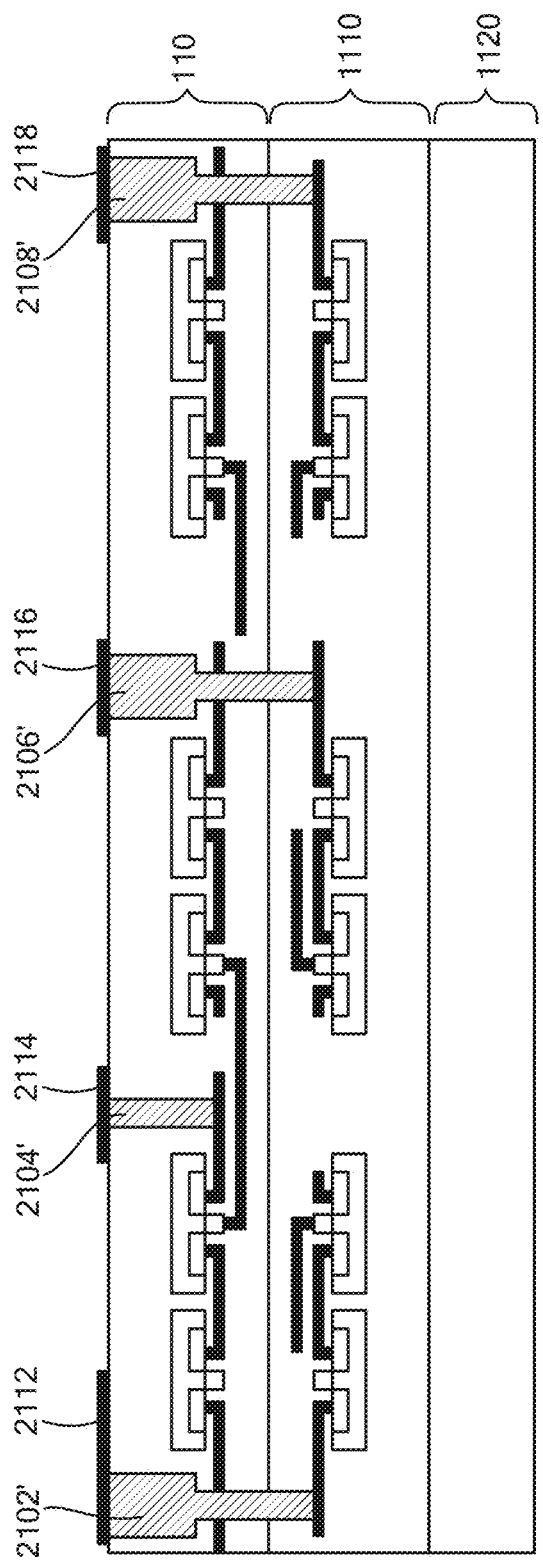

Referring now to FIG. 1E, in the illustrated embodiment, openings 2102, 2104, 2106 and 2108 in semiconductor structure 2100' are filled with a conductive material (e.g., using via-last techniques) to form corresponding conductive structures 2102', 2104', 2106' and 2108'. Conductive structures 2102', 2106' and 2108', which may be provided as three-dimensional (3D) vias, for example, form electrical connections between the second surface of semiconductor structure 2100' and select ones of the electrical connections in each of section 1110 and section 110. Additionally, conductive structure 2104' forms an electrical connection between the second surface of semiconductor structure 2100' and select ones of the electrical connections in section 110. In some embodiments, at least one of conductive structures 2102', 2104', 2106' and 2108' is provided as a through insulator via (TIV) or a through oxide via (TOV) conductive structure. Additionally, in some embodiments, at least one of conductive structures 2102', 2104', 2106' and 2108' is fabricated through a high-aspect ratio via fabrication process. Example conductive materials for conductive structures 2102', 2104', 2106' and 2108' include, but are not limited to: Titanium (Ti), Titanium-nitride (TiN), Tungsten (W) and/or other suitable electrically conductive materials.

A plurality of interconnect pads 2112, 2114, 2116 and 2118 (e.g., solderable metal pads), each having first and second opposing surfaces and one or more sides, are disposed over or beneath (e.g., attached or otherwise coupled to) select portions of the second surface of semiconductor structure 2100' and are electrically coupled to select ones of conductive structures 2102', 2104', 2106' and 2108'.

Additional aspects of example semiconductor structures (e.g., semiconductor structure 2100') including two sections (or 2-tiers) are described in co-pending International Application No. PCT/US2015/044679 entitled "Semiconductor Structures For Assembly In Multi-Layer Semiconductor Devices Including At Least One Semiconductor Structure," for example, which is assigned to the assignee of the present disclosure and incorporated herein by reference in its entirety. It should be appreciated that additional sections may be added to semiconductor structure 2100', as will be discussed.

Figure 2:
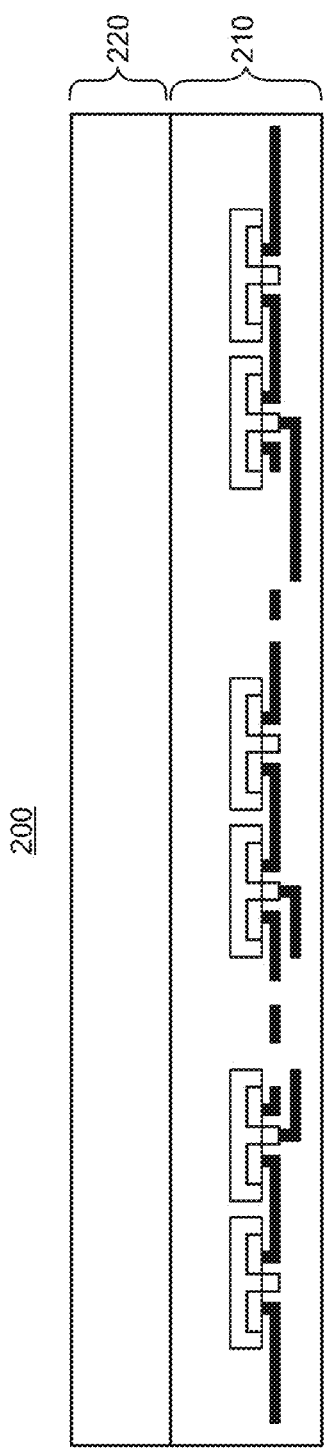
FIGS. 2-2E are block diagrams of example semiconductor structures as may also be fabricated using the example alignment device of FIG. 5 or 6, for example.

Referring now to FIG. 2, another example semiconductor structure 200 similar to semiconductor structure 100 of FIG. 1 is shown. Semiconductor structure 200 includes a section 210 (e.g., a tier-3 functional section) and a handle structure 220, each having first and second opposing surfaces. The first surface of handle structure 220 corresponds to a first surface of the semiconductor structure 200 and the second surface of section 210 corresponds to a second, opposing surface of the semiconductor structure 200.

Figure 2A:
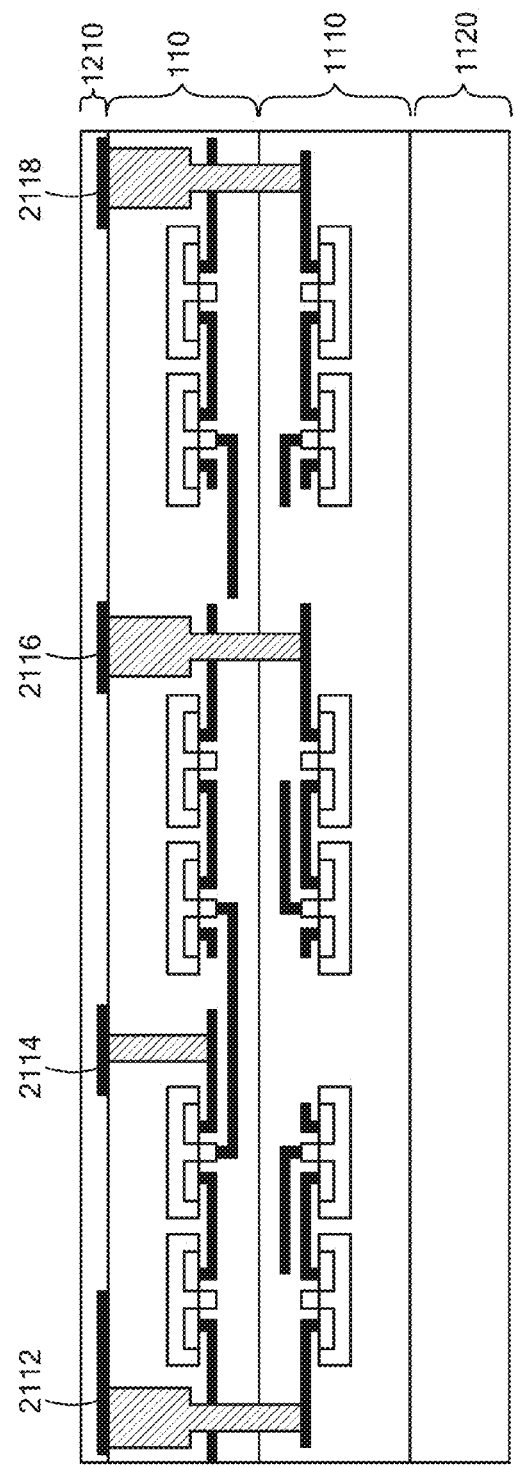

Referring now to FIG. 2A, in which like elements of FIG. 1E are shown having like reference designations, a semiconductor structure 1200 similar to semiconductor structure 2100' of FIG. 1E is shown. Here, however, semiconductor structure 1200 also includes an oxide-bond interface material or layer (also referred to herein as "oxide layer") 1210 which is deposited over the first surface of second section 1110 of semiconductor structure 1200 and second surfaces of interconnect pads 2112, 2114, 2116 and 2118. The second surface of the oxide layer 1210, which has first and second opposing surfaces, corresponds to the second surface of the semiconductor structure 1200 in the illustrated, and may be planarized (e.g., using a chemical mechanical planarization (CMP) process) such that the second surface of the oxide layer 1210 is substantially flat.

Figure 2B:
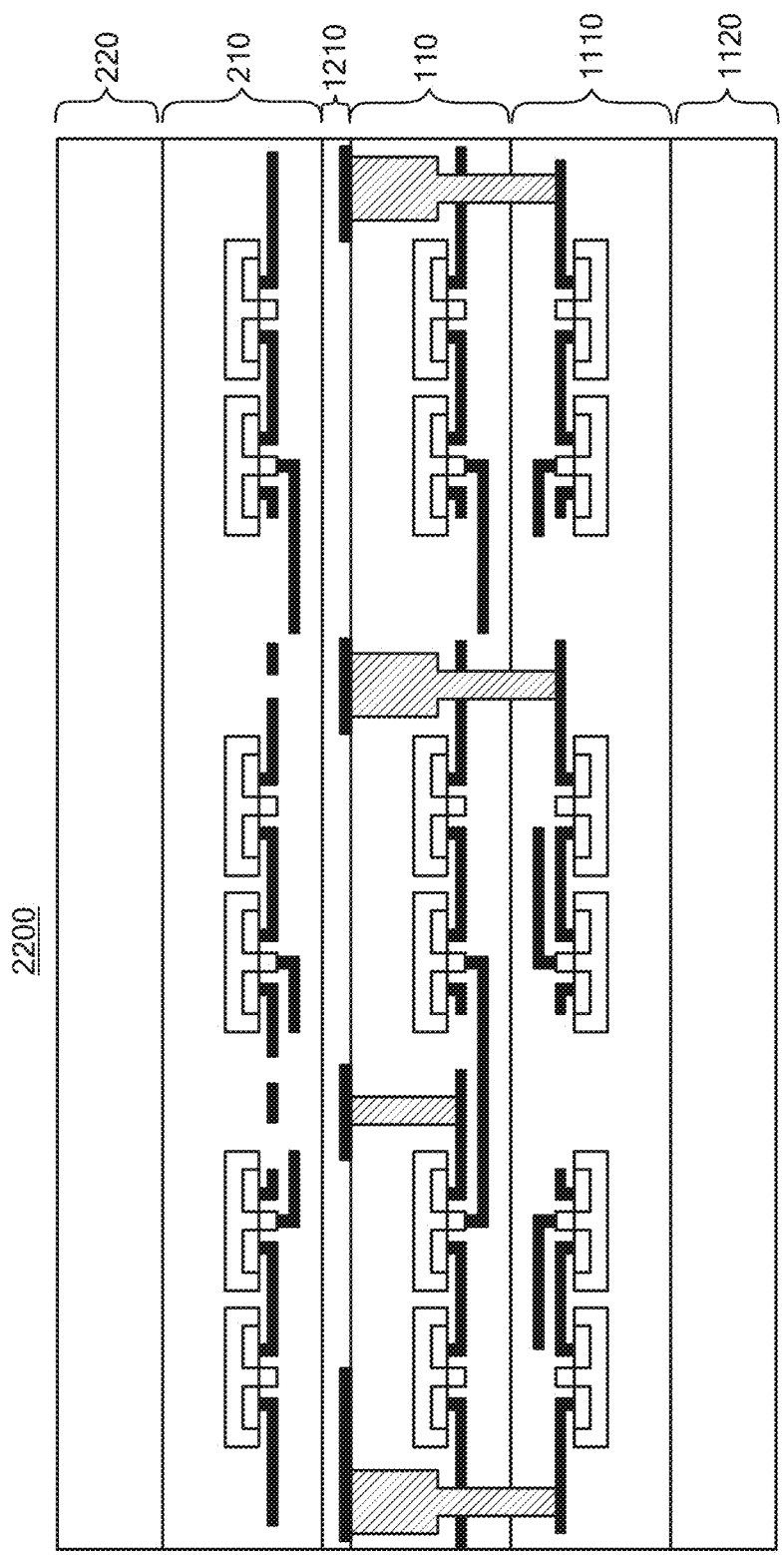

Referring now to FIG. 2B, an example multi-layer semiconductor structure 2200 as may be fabricated in accordance with an example method for aligning and coupling at least two semiconductor structures is shown. Semiconductor structure 2200 includes semiconductor structure 200 and semiconductor structure 1200 of FIGS. 2 and 2A, respectively, with the second surface of semiconductor structure 200 disposed over and coupled to the second surface of semiconductor structure 1200. Semiconductor structure 2200 includes sections 110, 1110, and 210 (e.g., tier-1, tier-2, and tier-3 functional sections, respectively), with sections 110 and 1110 provided from semiconductor structure 1200 and section 210 provided from semiconductor structure 200. The first surface of semiconductor structure 1200 corresponds to the first surface of semiconductor structure 2200, and the first surface of semiconductor structure 200 corresponds to the second surface of semiconductor structure 2200.

In one embodiment, semiconductor structure 200 is coupled to semiconductor structure 1200 by first aligning the second surface of semiconductor structure 200 with the second surface of semiconductor structure 1200 such that the second surface of semiconductor structure 200 and the second surface of semiconductor structure 1200 are substantially parallel to each other and spaced apart from each other by a predetermined separation distance. The predetermined separation distance may then be decreased from a first distance to a second, lower distance such that the second surface of semiconductor structure 200 and the second surface of semiconductor structure 1200 are substantially in contact with each other, and electrically coupled to each other.

Figure 2C:
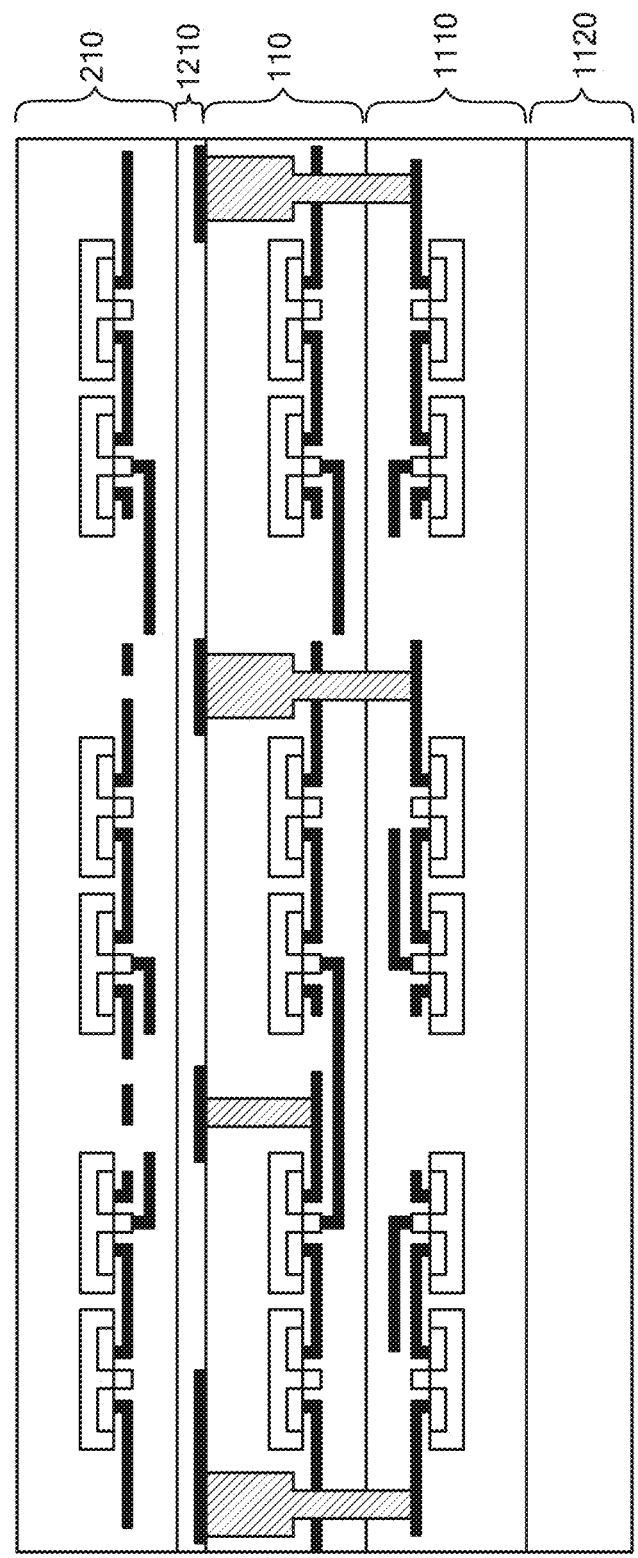

Referring now to FIG. 2C, an example multi-layer semiconductor structure 2200' similar to semiconductor structure 2200 is shown. Here, however, the semiconductor structure 2200' does not include handle structure 220. The handle structure 220 is removed such that the first surface of section 210 (i.e., the tier-3 functional section) is substantially exposed.

Figure 2D:
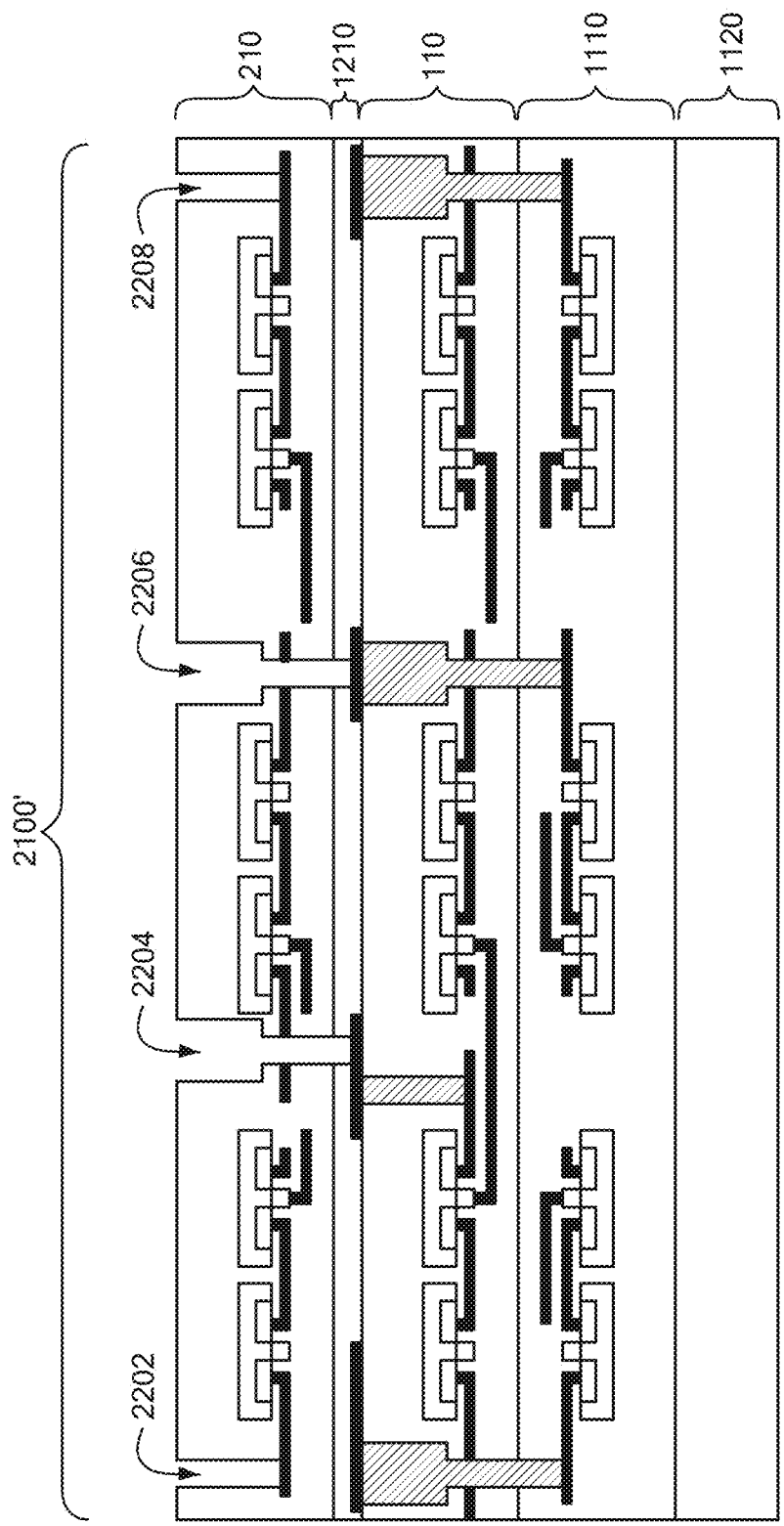

Referring now to FIG. 2D, a plurality of openings 2202, 2204, 2206 and 2208 are formed in select portions of the semiconductor structure 2200'. In the illustrated embodiment, openings 2202 and 2206 extend between the second surface of semiconductor structure 2200' and select ones of the electrical connections in section 210. Additionally, openings 2204 and 2208 extend between the second surface of semiconductor structure 2200' and second surfaces of interconnect pads 2114 and 2118.

Figure 2E:
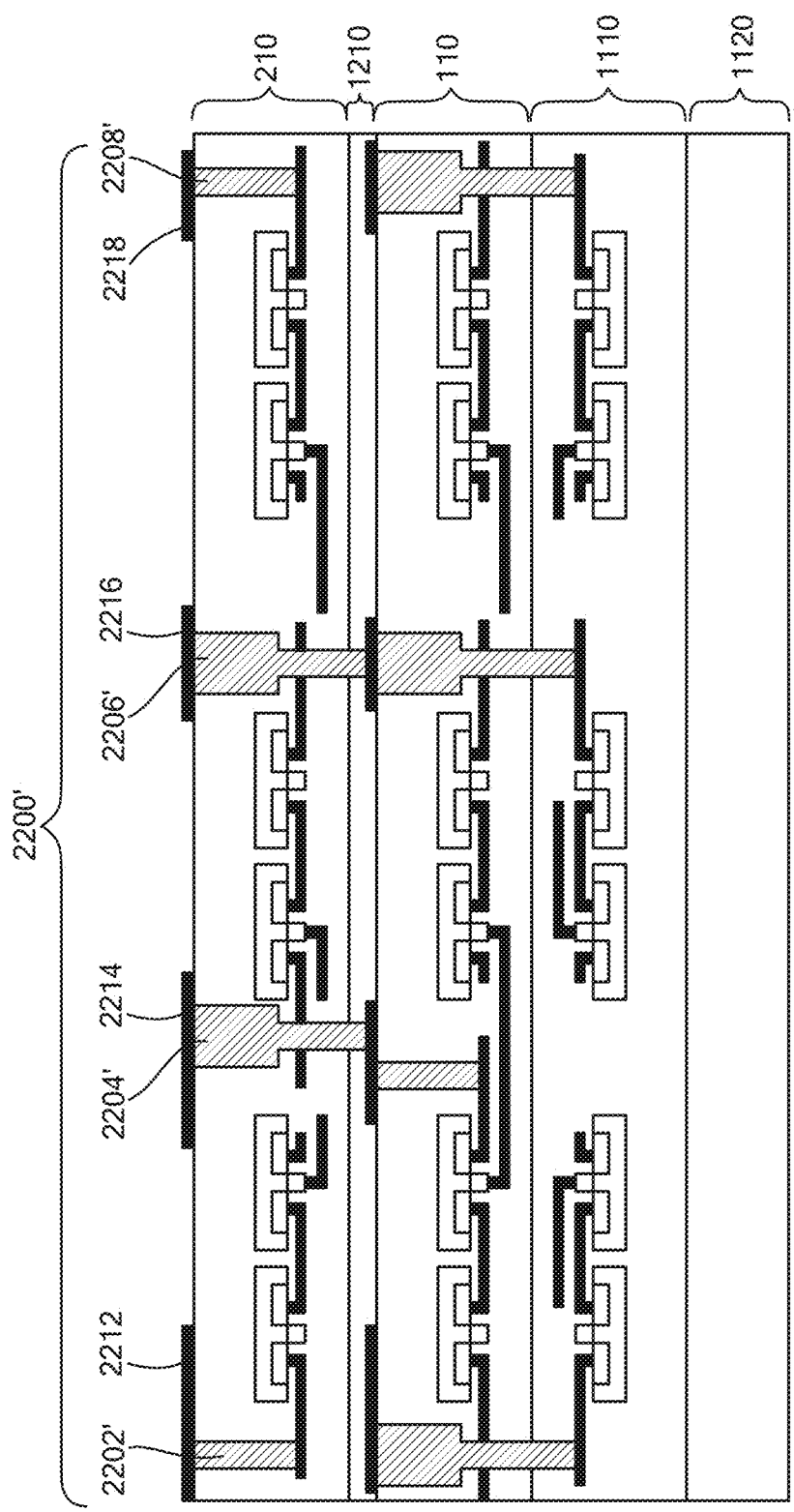

Referring now to FIG. 2E, in the illustrated embodiment, openings 2202, 2204, 2206 and 2208 in semiconductor structure 2200' are filled with a conductive material (e.g., using via-last techniques) to form corresponding conductive structures 2202', 2204', 2206' and 2208'. Conductive structures 2202' and 2208' form electrical connections between the second surface of semiconductor structure 2200' and select ones of the electrical connections in section 210. Additionally, conductive structure 2204' and 2206' form electrical connections between the second surface of semiconductor structure 2200', select ones of the electrical connections in section 210, and second surfaces of interconnect pads 2114, 2118.

A plurality of interconnect pads 2212, 2214, 2216 and 2218 (e.g., solderable metal pads), each having first and second opposing surfaces and one or more sides, are disposed over or beneath (e.g., attached or otherwise coupled to) select portions of the second surface of semiconductor structure 2200' and are electrically coupled to select ones of conductive structures 2202', 2204', 2206' and 2208'.

Although not specifically shown, it should be appreciate that semiconductor structure 2200' is scalable to include a plurality of additional semiconductor structures (not shown), such as fourth and fifth semiconductor structures.

Additional aspects of example semiconductor structures (e.g., semiconductor structure 2200') including three sections (or 3-tiers) are described in co-pending International Application No. PCT/US2015/044679, for example, which was referenced above.

Figure 3:
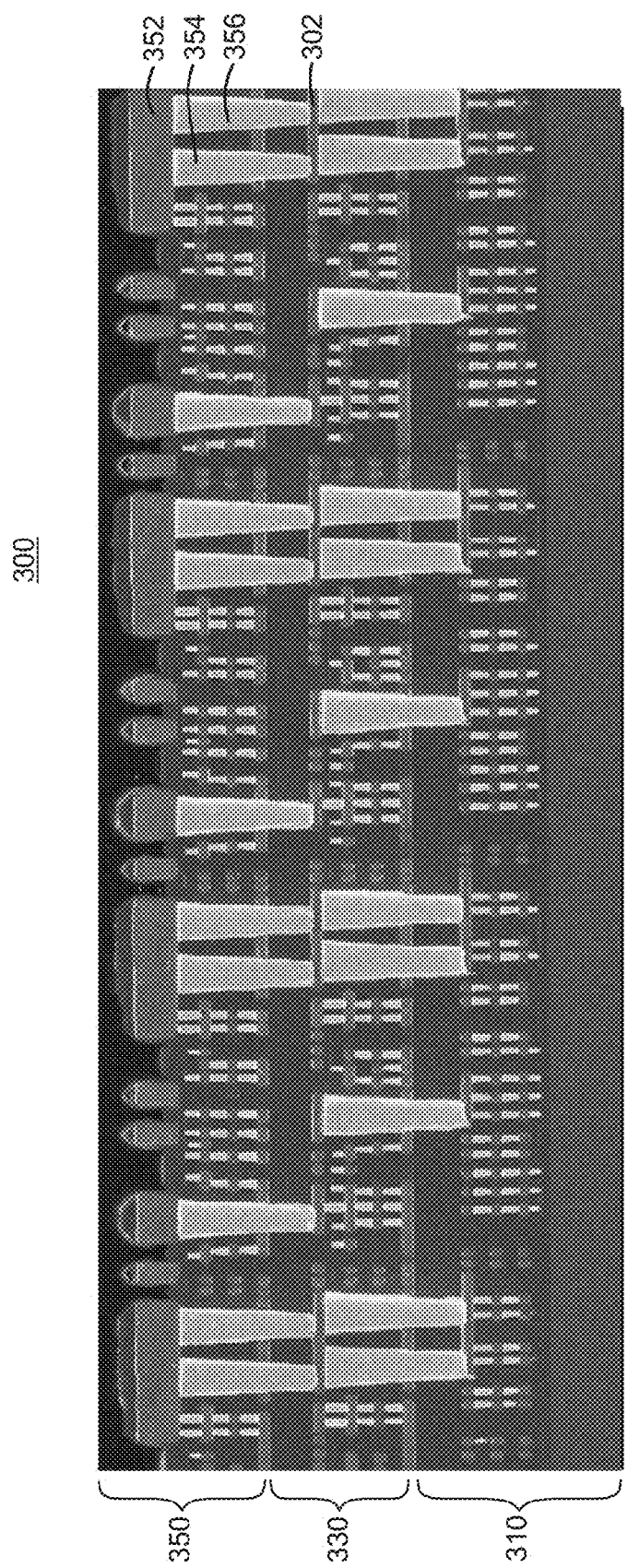
FIG. 3 is a cross-section of an example semiconductor structure which is similar to the semiconductor structure of FIG. 2E.

Referring now to FIG. 3, a cross-section of an example multi-layer semiconductor structure 300 as may be fabricated in accordance with an example method for aligning and coupling at least two semiconductor structures according to the disclosure (e.g., methods 700 and 1700 of FIGS. 7 and 7A, respectively, as will be discussed) is shown. Semiconductor structure 300, which is similar to semiconductor structure 2100' of FIG. 2E (i.e., a 3-tier semiconductor structure), includes a plurality of semiconductor structures, each of the semiconductor structures including one or more sections (e.g., functional sections or tiers). Each of the sections (here, sections 310, 330, 350) includes a device layer and an insulating layer, the device layer including one or more active or passive components (e.g., 352). Additionally, each of sections 310, 330, 350 includes a plurality of electrically connections (e.g., 354) which extends between select portions of first and second opposing surfaces of the sections 310, 330, 350.

Semiconductor structure 300 includes a plurality of interconnect pads (e.g., 302), each of the interconnect pads electrically coupled to select ones of the electrical connections in the semiconductor structure 300. Semiconductor structure 300 also includes a plurality of conductive structures (e.g., 356), each of the conductive structures electrically coupled to select ones of the interconnect pads and/or select ones of the electrical connections in the semiconductor structure 300.

In some embodiments, one or more of sections 310, 330, 350 may be provided as a fully depleted silicon on insulator (FDSOI) complementary metal-oxide semiconductor (CMOS) section (or tier). Additionally, in some embodiments, an oxide-bond interface material or layer (e.g., 320) is disposed between adjoining surfaces of the sections 310, 330, 350. Further, in some embodiments, one or more of the interconnect pads (e.g., 302) may include or be provided from one or more radio frequency (RF) shielding materials including, but not limited to, copper (Cu), aluminum (Al), zinc (Zn), and tin (Sn).

Figure 4:
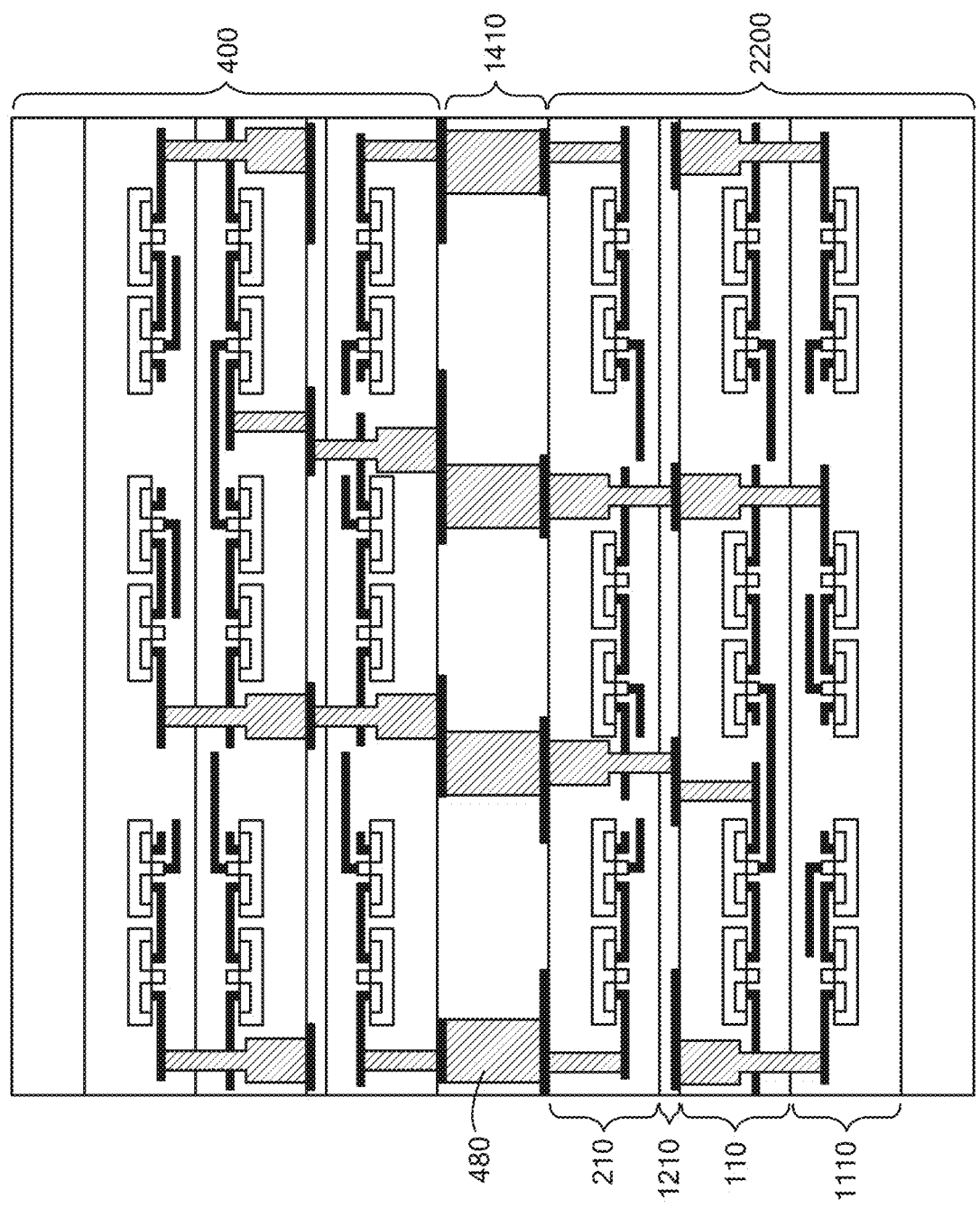
FIG. 4 is a block diagram of an example multi-layer semiconductor device as may be fabricated using the example alignment device of FIG. 5 or 6, for example, the multi-layer semiconductor device including the semiconductor structure of FIG. 2E.

Referring now to FIG. 4, an example multi-layer semiconductor device 1400 as may be fabricated in accordance with an example method for aligning and coupling at least two semiconductor structures according to the disclosure (e.g., methods 700 and 1700 of FIGS. 7 and 7A, respectively, as will be discussed) is shown. The multi-layer semiconductor device 1400 includes semiconductor structure 2200' of FIG. 2E, and a semiconductor structure 400 which is similar to the semiconductor structure 2200'. The multi-layer semiconductor device 1400 also includes a via joining layer 1410 (e.g., an interface layer) disposed between and coupled to select surfaces (e.g., second surfaces) of each of the semiconductor structure 400 and the semiconductor structure 2200'. The via joining layer 1410, which has first and second opposing surfaces and at least one conductive structure (e.g., conductive structure 1412) extending between select portions of the first and second surfaces, is aligned and coupled (e.g., using wafer-to-wafer bonding techniques, as will be discussed) to the select surfaces of each of the semiconductor structure 400 and the semiconductor structure 2200'.

In one embodiment, the via joining layer 1410 is aligned and bonded such that the at least one conductive structure is electrically coupled to second surfaces of select ones of the interconnect pads (e.g., interconnect pad 480) of the semiconductor structure 400 and the semiconductor structure 2200' to form one or more electrical connections between the semiconductor structure 400 and the semiconductor structure 2200'.

Additionally, in one embodiment, at least one of the electrical connections formed between the semiconductor structure 400 and the semiconductor structure 2200' is an electrical connection between select ones of the electrical connections in a first select section (e.g., a first section) of the semiconductor structure 400 and select ones of the electrical connections in a second select section (e.g., a second section) of the semiconductor structure 2200'.

Additional aspects of via joining layers, and multi-layer semiconductor devices including via joining layers, are described in co-pending International Application No. PCT/US2015/044608 entitled "Interconnect Structures For Assembly of Multi-layer Semiconductor Devices," which is assigned to the assignee of the present disclosure and incorporated herein by reference in its entirety.

Referring now to FIG. 5, an example semiconductor alignment device 500 as may be provided in a system for aligning at least two semiconductor structures (e.g., 100 and 1100, shown in FIGS. 1 and 1A) for coupling (e.g., bonding) in accordance with the concepts, systems, circuits, and techniques sought to be protected herein is shown.

The alignment device 500 includes a mounting structure 510 (e.g., a semiconductor structure mounting structure) and one or more imaging devices (here, imaging device 520) in the illustrated embodiment. The alignment device 500 also includes a first mounting portion 530 (e.g., a first semiconductor structure mounting portion) and a second mounting portion 540 (e.g., a second semiconductor structure mounting portion). Imaging device 520, first mounting portion 530 and second mounting portion 540 are each coupled to the mounting structure 510.

The mounting structure 510 has at least first and second opposing portions (here, first portion 510a and second portion 510b). The first portion 510a corresponds to a base portion of the mounting structure 510 and the second portion 510b corresponds to a portion which is distal to the base portion of the mounting structure 510 (i.e., first portion 510a). The mounting structure 510 also includes a processor 512 and a suction coupling and control means 514 (e.g., chuck control manifold) for coupling and controlling flow of a vacuum/pressure device (e.g., a vacuum supply, not shown) to the first mounting portion 530 and the second mounting portion 540 in the illustrated embodiment.

The processor 512 has an input coupled to an output of the imaging device 520. Additionally, the suction coupling and control means 514 has an input coupled to an output of the vacuum/pressure device, and outputs coupled to the first and second mounting portions 530, 540. The processor 512 and the vacuum/pressure device coupling and control means 514 are optional in some embodiments, and may be provided separate from the mounting structure 510 in some embodiments, and are, thus, shown in phantom.

The first mounting portion 530, may be provided as a first wafer chuck for supporting (or holding, attaching or otherwise securing) a first semiconductor structure (e.g., 100) in place (e.g., in a fixed position) during alignment and bonding of the first semiconductor structure to a second semiconductor structure (e.g., 1100). Mounting portion 530 may, for example, be movably coupled to the first portion 510*a* of mounting structure 510. The first mounting portion 530 is also configured to couple to a select surface or portion (e.g., a first surface) of a semiconductor structure (e.g., a first semiconductor structure). In one embodiment, the first mounting portion 530 is communicatively coupled to the above-described vacuum/pressure device via the above-described suction coupling and control means 514, and the flow provided by the vacuum/pressure device is used to mount the select surface or portion of the semiconductor structure to the first mounting portion 530.

The second mounting portion 540 may be the same as or similar to the first mounting portion 530 (e.g., a wafer chuck). In some embodiments, the second mounting portion 540 is movably coupled to the second portion 510*b* of mounting structure 510. The second mounting portion 540 is also configured to couple to a select surface or portion (e.g., a second surface) of a semiconductor structure (e.g., a second semiconductor structure) and is movable with respect to the first mounting portion 530 of alignment device 500.

In one embodiment, the first mounting portion 530 is also movable with respect to the second mounting portion 540 (i.e., the second mounting portion 540 and the first mounting portion 530 are movable with respect to each other). Similar to first mounting portion 530, in one embodiment the second mounting portion 540 is communicatively coupled to the above-described vacuum/pressure device via the above-described suction coupling and control means 514, and the flow provided by the vacuum/pressure device is used to mount (or otherwise hold or secure) the select surface or portion of the semiconductor structure to the second mounting portion 540.

It should, of course, be appreciated that other means for mounting or otherwise holding or securing semiconductor structures to the first mounting portion 530 and the second mounting portion 540 (e.g., other than the vacuum/pressure device and the suction coupling and control means 514) are of course possible. For example, a mechanical structure (rather than a vacuum mechanism) may be use to secure semiconductor structures to respective ones of the mounting portions.

Imaging device 520 may be provided, for example, as a capacitive sensor, laser profilometer, infrared (IR) sensor or other non-contact sensing device. Imaging device 520 may be positioned substantially proximate to one or more portions of at least one of the semiconductor structures (e.g., first semiconductor structure) mounted to the first and second mounting portions 530, 540.

Additionally, imaging device 520 is configured to capture and/or detect alignment marks (e.g., fiducial marks) in at least one of the semiconductor structures to be aligned by the alignment device 500 and bonded. As noted above in conjunction with FIGS. 1-1B, the alignment marks may be etched or deposited on the semiconductor structures, and may be used to determine a position of a first semiconductor structure to be aligned (e.g., a semiconductor structure supported by first mounting portion 530) relative to a second semiconductor structure to be aligned (e.g., a semiconductor structure supported by second mounting portion 540).

The imaging device 520 may also be configured to provide alignment mark images (e.g., individual still frames) captured by the imaging device 520 to the processor 512. In response to receiving the alignment mark images, the processor 512 may, for example, determine an alignment error between a select surface or portion of the first semiconductor structure to be aligned and a select surface or portion of the second semiconductor structure to be aligned. Additionally, in response to receiving the alignment mark images, the processor 512 may control the first mounting portion 530 and/or the second mounting portion 540 to vary the x, y and z positions of the first mounting portion 530 and/or the second mounting portion 540 and, thus, the x, y and z positions of the first and second semiconductor structures to be aligned.

The imaging device 520 and/or the processor 512 may also determine a best-fit plane of at least one of the first and second semiconductor structures. Further, in response to receiving the alignment mark images, the processor 512 may move the first mounting portion 530 and/or the second mounting portion 540 proximate to each other for alignment and bonding of the first semiconductor structure and the second semiconductor structure.

In one embodiment, it is desirable to match alignment marks of the first semiconductor structure with alignment marks of the second semiconductor structure prior to the processor 512 controlling and/or moving the first and second mounting portions 530, 540. Additionally, in one embodiment, alignment of the semiconductor structures is at least partially dependent upon transparency of the first and second semiconductor structures and/or surface roughness of the first and second semiconductor structures.

In some embodiments, the alignment device 500 may also include one or more vacuum portions (e.g., vacuum rings including but not limited to concentric vacuum rings, not shown) which may be used for receiving suction flow from the vacuum/pressure device and mounting (or otherwise holding or securing) semiconductor structures (e.g., first and second semiconductor structures) to the first and second mounting portions 530, 540. The vacuum portions may be provided on or coupled to the first and second mounting portions 530, 540 and be communicatively coupled to the vacuum/pressure device via the suction coupling and control means 514. The vacuum portions may be divided into one or more zones (e.g., suction zones) to control bonding sequences of semiconductor structures, for example.

Additionally, in some embodiments, the mounting structure 510 may include a lifting means (not shown) for moving the first mounting portion 530 relative to the second mounting portion 540, the second mounting portion 540 relative to the first mounting portion 530, or the first and second mounting portions 530, 540 relative to each other. The lifting means may have a first portion coupled to the first mounting portion 530 and a second portion coupled to the second mounting portion 540.

Referring now to FIG. 6, in which like elements of FIG. 5 are provided having like reference designations, another example semiconductor alignment device 600 includes imaging device 520, first mounting portion 530 and second mounting portion 540. The alignment device 600 also includes a mounting structure 610 (e.g., a semiconductor structure mounting structure) and a second imaging device 620, which may be the same as or similar to the first imaging device 520. First and second imaging devices 520, 620 and first and second mounting portions 530, 540 are each coupled to the mounting structure 610.

The mounting structure 610 has at least first and second opposing portions (here, first portion 610*a* and second portion 610*b*) and includes the processor 512 and the suction coupling and control means 514. The first portion 610*a* corresponds to a base portion of the mounting structure 610 and the second portion 610b corresponds to a portion which is distal to the base portion of the mounting structure 610 (i.e., first portion 610a). The processor 512 has inputs coupled to outputs of the first and second imaging devices 520, 620. Additionally, the suction coupling and control means 514 has an input coupled to an output of a vacuum/pressure device (not shown), and outputs coupled to the first and second mounting portions 630, 640.

The mounting structure 610 also includes at least one frame grabber (here, first frame grabber 611 and second frame grabber 612) or other image capture devices and a plurality of alignment stages (here, first stage 616, second stage 617 and third stage 618) which may be provided as part of a precision positioning system (e.g., an actuator system). The mounting structure 610 additionally includes control circuitry (here, first control circuit 613, second control circuit 614 and third control circuit 615) for controlling the alignment stages, as will be discussed.

The first frame grabber 611 is disposed in a signal path between an output of first imaging device 520 and a corresponding input of processor 512, and the second frame grabber 612 is disposed in a signal path between an output of second imaging device 620 and a corresponding input of processor 512. Additionally, the first control circuit 613 is disposed in a signal path between an input of the first stage 616 (e.g., a piezoelectric stage) and a corresponding input of processor 512, and second control circuit 614 is disposed in a signal path between an input of second stage 617 (e.g., a rotational stage) and a corresponding input of processor 512. Further, third control circuit 615 is disposed in a signal path between an input of third stage 618 (e.g., an X/Y stage) and a corresponding input of processor 512. The first and second frame grabbers 611, 612 and the first, second and third control circuits 613, 614, 615 are optional in some embodiments and are thus shown in phantom in FIG. 6.

The first mounting portion 530 is movably coupled to the first portion 610a of mounting structure 610, and is configured to hold or otherwise secure a select surface or portion (e.g., a first surface) of a semiconductor structure (e.g., a first semiconductor structure). Additionally, the second mounting portion 540 is movably coupled to the second portion 610b of mounting structure 610, and is configured to hold or otherwise secure a select surface or portion (e.g., a second surface) of a semiconductor structure (e.g., a second semiconductor structure). The first mounting portion 530 may be movable with respect to the second mounting portion 540, and/or the second mounting portion 540 may be movable with respect to the first mounting portion 530.

The first and second imaging devices 520, 620 are positioned substantially proximate to one or more portions of at least one of the semiconductor structures (e.g., first semiconductor structure) mounted to the first and second mounting portions 530, 540. Additionally, the first and second imaging device 520, 620 are configured to capture and/or detect alignment marks in at least one of the semiconductor structures (e.g., a first semiconductor structure) to be aligned by the alignment device 600. The imaging devices may be in a fixed position or selectively positioned depending upon the needs of a particular application.

In one embodiment, two imaging devices (here, imaging devices 520, 620) are used to capture and/or detect a sufficient number of alignment marks for alignment (including, but not limited to rotational alignment) of the first semiconductor structure with respect to a second semiconductor structure to be aligned and bonded by the alignment device 600. Additionally, in one embodiment, a third imaging device (or even more imaging devices) may be used to capture and/or detect sufficient alignment marks for determining a reference plane of the first and second mounting portions 530, 540, as will be discussed.

The first frame grabber 611 is coupled to receive first alignment mark images captured by the first imaging device 520 at an input and, in response to receiving the first alignment mark images, is configured to provide select ones of the first alignment mark images to an output of the first frame grabber 611. Additionally, the second frame grabber 612 is coupled to receive second alignment mark images captured by the second imaging device 620 at an input and, in response to receiving the second alignment mark images, is configured to provide select ones of the second alignment mark images to an output of the second frame grabber 612. The first and second alignment mark images may be received at corresponding inputs of the processor 512 for processing (e.g., for determining an alignment error between first and second semiconductor structures). In one embodiment, at least one of the first and second frame grabbers 611, 612 provides for the displaying, capturing, storing, and/or previewing of alignment mark images (e.g., individual alignment mark images) captured by the first and second imaging devices 520, 620 (e.g., on an output display of processor 512).

In response to receiving the first and second alignment mark images, the processor 512 may adjust one or more positions (e.g., x, y or z positions) of at least one of the first and second mounting portions 530, 540 and, thus, positions of a first semiconductor structure with respect to a second semiconductor structure. Positions of the first mounting portion 530 may, for example, be adjusted using at least one of the first stage 616, second stage 617 and third stage 618, each of which is coupled to first mounting portion 530 in the illustrated embodiment. In one embodiment, the second stage 617 (e.g., a rotational stage) is used for coarse or rough Z axis positioning of the first mounting portion 530, and the third stage 618 (e.g., an X/Y stage) is used for coarse X and Y axis positioning or alignment of the first mounting portion 530. Additionally, in one embodiment, the first stage 616 (e.g., a piezoelectric stage) is provided having multiple degrees-of-freedom (DOF), and is used for highly precise positioning of the first mounting portion 530. As one example, the first stage 616 may be provided as a six-axis (X, Y, Z, pitch, roll and yaw) piezoelectric stage (i.e., a piezoelectric stage which has six DOF). In providing for coarse positioning of the first mounting portion 530, the second and third stages 617, 618 may have a greater range of movement than that provided by first stage 616.

The first stage 616 may be controlled via the first control circuit 613, the second stage 617 may be controlled via the second control circuit 614, and the third stage 618 may be controlled via the third control circuit 615, with each of the control circuits coupled to receive control signals from the processor 512. In some embodiments, the first stage 616, second stage 617 and the third stage 618 may also be controlled directly via the processor 512 (e.g., through one or more algorithms in the processor 512). A result of the alignment performed by the alignment device 600 may be saved in a memory device (e.g., a memory device in the processor 512) (not shown), provided in an output signal of the processor 512, and/or displayed on a visual indicator (e.g., LED or monitor) (not shown) as a few examples. It should be appreciated that the example alignment device configurations described above in conjunction with FIGS. 5 and 6 (e.g., alignment devices 500 and 600) are but several of many potential configurations of alignment devices in accordance with the concepts, systems, circuits and techniques described herein. Alignment devices having comparable or different structures or circuitry are of course possible.

Additionally aspects of alignment and bonding processes which may be performed by the alignment devices disclosed herein (e.g., 500, 600) will be discussed further in conjunction with the below figures.

Figure 7A:
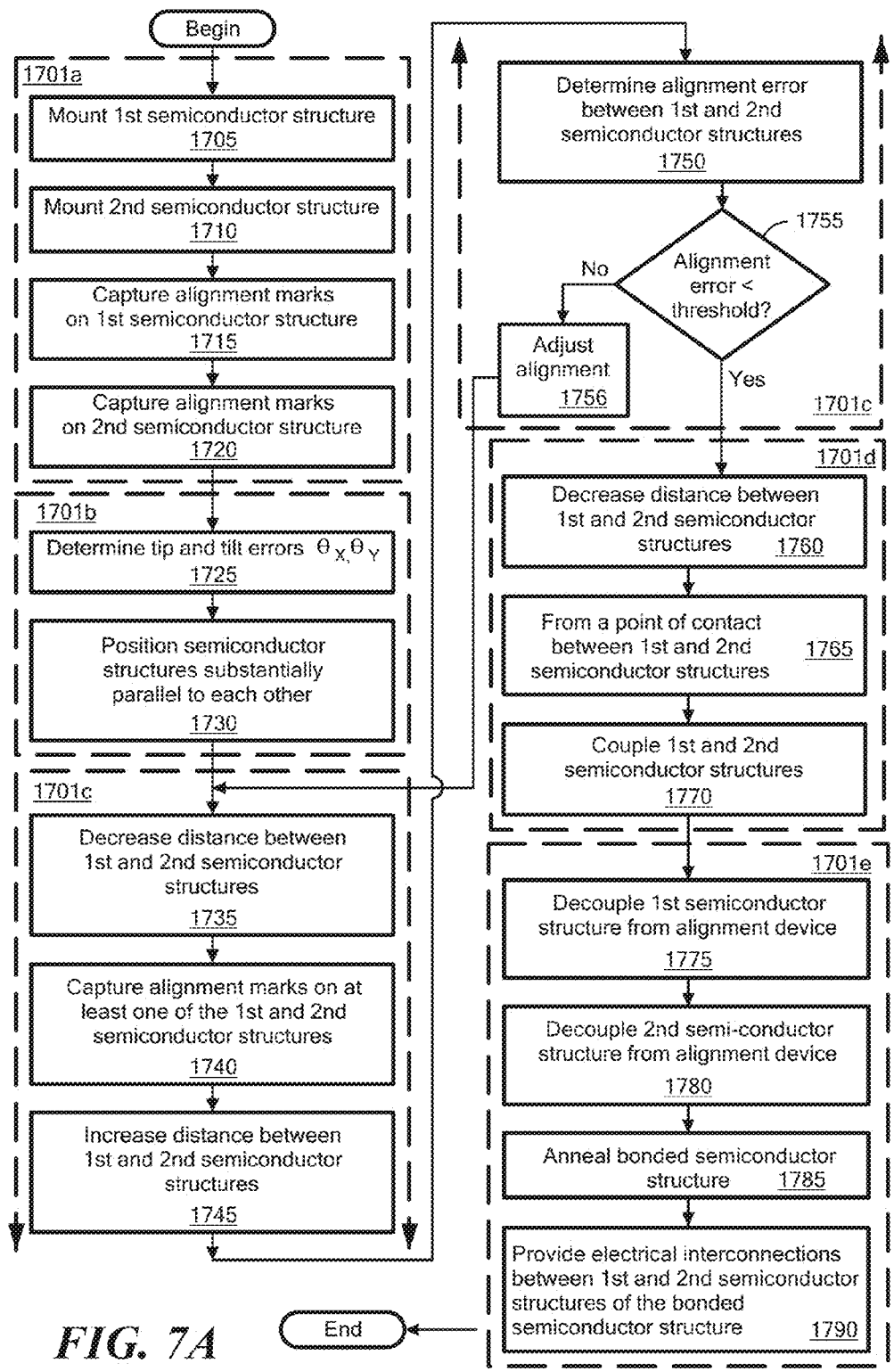
FIG. 7A is a more detailed flow diagram illustrating a method for aligning two or more semiconductor structures.

FIGS. 7 and 7A, are flowcharts illustrating example methods for aligning two or more semiconductor structures (e.g., such as structures 100 and 1100, shown in FIGS. 1 and 1A) for bonding are shown. The methods 700, 1700 can each be implemented in a system including a semiconductor structure alignment device such as the alignment device 500 and 600 describe above in conjunction with FIGS. 5 and 6, for example.

Rectangular elements (typified by element 705 in FIG. 7), as may be referred to herein as "processing blocks," may represent computer software instructions or groups of instructions (e.g., in processor 512 of alignment device 600 of FIG. 6). Diamond shaped elements (typified by element 720 in FIG. 7), as may be referred to herein as "decision blocks," represent computer software instructions, or groups of instructions, which affect the execution of the computer software instructions represented by the processing blocks. The processing blocks and decision blocks can represent steps performed by functionally equivalent circuits such as a digital signal processor circuit or an application specific integrated circuit (ASIC).

The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa.

Turning now to FIG. 7, a method 700 for aligning two or more semiconductor structures for bonding in a system including a semiconductor structure alignment device (e.g., 600, shown in FIG. 6) begins at block 705 in which two or more semiconductor structures are mounted or otherwise secured to corresponding mounting portions (e.g., 530, 540) of an alignment device. One or more imaging devices (such as imaging device 520 in FIG. 6) of the alignment device capture alignment marks (e.g., fiducial marks) on one or more layers of each of the semiconductor structures to be bonded or otherwise joined. The semiconductor structures may include first and second semiconductor structures (e.g., 100, 1100), Each of the semiconductor structures has first and second opposing surfaces, one or more layers of semiconductor material disposed between the first and second surfaces, and one or more alignment marks in at least one of the layers. Thus, the alignment marks captured by the imaging devices include first alignment marks in one or more layers of the first semiconductor structure and second corresponding alignment marks in one or more layers of the second semiconductor structure.

At block 710, in response to alignment marks having been captured by the imaging devices, the semiconductor structures are made parallel with respect to each other (e.g., prior to alignment and bonding). In particular, the alignment device is operated (i.e., controlled) to position a select surface or portion (e.g., a second surface) of a first one of the semiconductor structures (e.g., 100) substantially parallel with respect to a select surface or portion (e.g., a first surface) of a second one of the semiconductor structures (e.g., 1100) based on the alignment mark images captured by the imaging device. The semiconductor structures may, for example, be positioned through use of at least one alignment stage (e.g., first stage 616) of the alignment device which may control at least one of an X, Y, Z, $\theta_x$, $\theta_y$, or $\theta_z$ position of the semiconductor structures with respect to each other. In one aspect, by positioning the semiconductor structures substantially parallel to each other, the alignment device is able to more accurately capture alignment mark images during alignment of the semiconductor structures (e.g., in block 715, as will be discussed) and, in turn, more accurately align the semiconductor structures for bonding (e.g., in block 720, as will be discussed).

At block 715, the imaging devices capture additional alignment marks (i.e., a second set of alignment marks) on one or more of the semiconductor structures and the alignment device is operated to align the semiconductor structures for coupling based on the captured alignment marks. In particular, the alignment device is operated to decrease a distance (e.g., a Z distance or offset) between the select surfaces or portions of the semiconductor structures from a first predetermined distance to a second, lower predetermined distance (e.g., a distance such that the semiconductor structures are substantially close to each other, but not touching). The foregoing occurs for a first predetermined time period which is substantially less than the stiction time for bonding to be initiated between the semiconductor structures. After the first predetermined time period, the alignment device is operated to increase the distance from the second predetermined distance to a distance which is substantially greater than the second predetermined distance (e.g., a distance which is between the second predetermined distance and the first predetermined distance). In one embodiment, the alignment marks captured at block 715 are the same as or similar to the alignment marks captured at block 705. In another embodiment, at least one of the alignment marks captured at block 715 are different from the alignment marks captured at block 705.

At decision block 720, the alignment device (e.g., a processor 512 of the alignment device 600) determines an alignment error between the semiconductor structures (e.g., using one or more edge detection algorithms) and also determines whether the alignment error is greater than or less than a predetermined (e.g., a user selected) alignment error threshold. If the alignment device determines that the alignment error is less than the alignment error threshold (i.e., alignment accuracy has been achieved), the method proceeds to a block 1725.

Alternatively, if the alignment device determines that the alignment error is greater than the alignment error threshold (i.e., alignment accuracy has not been achieved), the method returns to a block 715. Blocks 715 and 720 may be repeated (e.g., automatically repeated) until the alignment error between the semiconductor structures is less than the alignment error threshold (e.g., to achieve a desired alignment accuracy between the semiconductor structures).

In some embodiments, several measurements are made before an alignment error value is compared to an alignment error threshold value. In some embodiments, several measurements are made and a mean (average) error value, or a median error value is compared to an alignment error threshold value.

Once a desired alignment accuracy between the semiconductor structures is achieved, at block 725, the alignment device is operated to decrease a distance between the select surfaces or portions of the semiconductor structures to a distance suitable for bonding, and the semiconductor structures are subsequently bonded to form a bonded semiconductor structure (i.e., a multi-layer semiconductor structure). In one embodiment, the semiconductor structures are bonded subsequent to establishing one or more points of contact between the semiconductor structures, as described further below in conjunction with method 1700 of FIG. 7A.

At block 730, the semiconductor structures (i.e., the bonded semiconductor structure) are removed from the alignment device and fabrication of the bonded semiconductor structure (e.g., 2100, shown in FIG. 1B) is completed. For example, electrical interconnections may be made between the semiconductor structures at block 730. Subsequent to block 730, the method 700 ends. The method 700 ending may correspond to two semiconductor structures having been aligned and bonded. In one embodiment, the method 700 may be repeated N times for adding N additional semiconductor structures (e.g., 200, shown in FIG. 2) to the bonded semiconductor structure (e.g., to form a subsequent bonded semiconductor structure such as semiconductor structure 2200, shown in FIG. 2B).

In one aspect of the concepts, systems, circuits and techniques sought to be protected herein, the above-described method 700 provides for increased accuracy in alignment of semiconductor structures, and for semiconductor structures and devices having increased circuit density.

Referring now to FIG. 7A, a method 1700 for aligning two or more semiconductor structures for bonding includes a process 1701*a* for capturing alignment marks on semiconductor structures to be aligned and bonded (e.g., blocks 1705, 1710, 1715, 1720), a process 1701*b* for planarizing the semiconductor structures with respect to each other (e.g., blocks 1725, 1730), and a process 1701*c* for aligning the semiconductor structures for bonding (e.g., blocks 1735, 1740, 1745, 1750, 1755). The method 1700 also includes a process for bonding the semiconductor structures (e.g., blocks 1760, 1765, 1770), and a process for removing the semiconductor structures and substantially completing fabrication of a multi-layer semiconductor structure including the semiconductor structures (e.g., blocks 1775, 1780, 1785, 1790).

In some embodiments, process 1701*a* may be the same as or similar to block 705 of method 700 of FIG. 7, process 1701*b* may be the same as or similar to block 710 of method 700, and process 1701*c* may be the same as or similar to blocks 715 and 720 of method 700. Additionally, in some embodiments, process 1701*d* may be the same as or similar to block 725 of method 700 and process 1701*e* may be the same as or similar to block 730 of method 700.

As illustrated, the method 1700 begins at a block 1705 where a first select surface or portion (e.g., a second surface) of a first semiconductor structure is mounted, loaded, held or otherwise secured to a first mounting portion (e.g., 530, shown in FIG. 5) of a semiconductor structure alignment device (e.g., 600, shown in FIG. 6).

The first semiconductor structure has first and second opposing surfaces, one or more layers of semiconductor material disposed between the first and second surfaces, and one or more alignment marks in at least one of the layers. In one embodiment, the first select surface or portion of the first semiconductor structure may be a select surface or portion of a handle wafer or structure (e.g., 150) which may be provided as part of or separate from the first semiconductor structure in some embodiments.

At block 1710, a first select surface or portion (e.g., a first surface) of a second semiconductor structure (e.g., 1100) is mounted to a second mounting portion (e.g., 540) of the alignment device. Similar to the first semiconductor structure, the second semiconductor structure has first and second opposing surfaces, one or more layers of semiconductor material disposed between the first and second surfaces, and one or more alignment marks in at least one of the layers. Additionally, similar to the select surface or portion of the first semiconductor structure, in one embodiment the select surface or portion of the second semiconductor structure may be a select surface or portion of a handle wafer or structure (e.g., 1150) which may be provided as part of or separate from the second semiconductor structure in some embodiments.

At block 1715, one or more imaging devices (e.g., 520, 620, shown in FIG. 6) of the alignment device are positioned proximate to the first semiconductor structure and capture one or more of the alignment marks provided on the first semiconductor structure. Additionally, at block 1720, one or more of the imaging devices are positioned proximate to the second semiconductor structure and capture one or more alignment marks provided on the second semiconductor structure.

In one embodiment, the alignment marks captured by the imaging devices include first alignment marks provided on the first semiconductor structure and second corresponding alignment marks provided on the second semiconductor structure. Additionally, in one embodiment, the first and second alignment marks are captured substantially simultaneously (e.g., at a first point in time). In another embodiment, the first and second alignment marks may be captured at different times (e.g., at first and second points in time).

Subsequent to block 1720, the method 1700 proceeds to process 1701*b* at processing block 1720. At block 1720, in response to the alignment marks having been captured by the imaging devices, tilt and tip errors $\theta_x$, $\theta_y$ of a second select surface or portion of the first semiconductor structure are determined with respect to a surface or portion (e.g., an opposing surface to the first select surface) of the second semiconductor structure. In one illustrative embodiment, the tilt and tip errors $\theta_x$, $\theta_y$ are determined by comparing a best-fit plane of the second select surface or portion of the first semiconductor structure with a best-fit plane of the second select surface or portion of the second semiconductor structure. In one embodiment, these best-fit planes are determined based upon the alignment mark images captured by the imaging devices at block 1715.

At block 1730, the second select surface or portion of the first semiconductor structure is positioned substantially parallel with respect to the second select surface or portion of the second semiconductor structure based upon the determined tilt and tip errors. In particular, the alignment device is operated to position the second select surfaces or portions substantially parallel with respect to each other at a first predetermined distance (e.g., by adjusting a position of X, Y and/or $\theta_x$, $\theta_y$, $\theta_z$ axes of at least one of the first and second mounting portions of the alignment device and, in turn, X, Y and/or $\theta_x$, $\theta_y$, $\theta_z$ positions of at least one of the first and second semiconductor structures). The first predetermined distance may, for example, correspond to a Z position (i.e., a Z offset) of the first and second semiconductor structures with respect to each other and be based upon knowledge of a position of one or more alignment marks of the first semiconductor structure relative to one or more alignment marks of the second semiconductor structure (e.g., from the captured alignment mark images). In one embodiment, the first predetermined distance is between about one hundred microns (μm) and about two hundred μm.

The alignment device may also be operated to position the first and second semiconductor structures substantially parallel with respect to each other based upon knowledge of a position of the alignment marks in at least one of the semiconductor structures relative to a mechanical locating feature (e.g., a notch) on the alignment device. In one embodiment, the surfaces or portions are positioned through use of at least one alignment stage (e.g., first stage 616) of the alignment device. Additionally, in one embodiment, by positioning the semiconductor structures substantially parallel to each other at the first predetermined distance, image clarity of the alignment mark images subsequently captured by the alignment device is improved which may, in turn, improve alignment of the semiconductor structures.

Subsequent to block 1730, the method 1700 proceeds to process 1701*c* (e.g., a "BOX-in-BOX" semiconductor structure alignment process) at block 1735. At block 1735, the alignment device is operated to decrease the distance (e.g., a Z position distance or offset) between the second select surface or portion of the second semiconductor structure (e.g., a BOX layer of the second semiconductor structure) and the second select surface or portion of the first semiconductor structure (e.g., a BOX layer of the first semiconductor structure) from the first predetermined distance to a second, lower predetermined distance for a first predetermined time period. The first predetermined time period is substantially less than the stiction time for bonding to be initiated between the first and second semiconductor structures. In one embodiment, the first predetermined time period is substantially less than about one-hundred milliseconds. At block 1735, the alignment device may also be operated to adjust X, Y, $\theta_x$, $\theta_y$, and $\theta_z$ positions of the semiconductor structures with respect to each other (e.g., such that the semiconductor structures are substantially aligned).

At block 1740, one or more of the alignment marks in at least one of the first and second semiconductor structures are captured by the imaging devices at a second time. In one embodiment, the alignment marks captured at block 1740 are the same as or similar to the alignment marks captured at blocks 1715 and/or 1720. In another embodiment, at least one of the alignment marks captured at block 1740 is different from the alignment marks captured at blocks 1715 and 1720.

At block 1745, after the first predetermined time period, the alignment device is operated to increase the distance between the second select surface or portion of the second semiconductor structure and the second select surface or portion of the first semiconductor structure from the second, lower predetermined distance to a distance which is substantially equal to the first predetermined distance (or another distance that is greater than the second predetermined distance). By limiting the time period at which the distance between the second select surface of the second semiconductor structure and the second select surface or portion of the first semiconductor structure is at the second, lower predetermined distance, areas of the first and semiconductor structures which might touch (e.g., due to the proximity of the semiconductor structures) will not have sufficient time to form a corresponding bond. In one aspect of the concepts, systems, circuits and techniques sought to be protected herein, the foregoing is critical to achieving alignment both pre and post bond.

At block 1750, an alignment error of the second select surface or portion of the first semiconductor structure with respect to the second select surface or portion of the second semiconductor structure is determined using the alignment mark images captured by the imaging devices at the second time. In one embodiment, the alignment error is determined by applying one or more edge detection algorithms to the alignment mark images captured at the second time. Other techniques, may of course, also be used.

At decision block 1755, a decision is made (e.g., by the alignment device or a processor 512 of the alignment device 600) as to whether the alignment error is greater than or less than a predetermined (e.g., a user selected) alignment error threshold. If a decision is made that the alignment error is less than the alignment error threshold (i.e., alignment accuracy has been achieved), the method proceeds to a block 1765 at which a process 1701*d* for bonding the first and second semiconductor structures begins.

Alternatively, if a decision is made that the alignment error is greater than the alignment error threshold (i.e., alignment accuracy has not been achieved), then processing proceeds to block 1756 in which an alignment adjustment is made (i.e. the relative positions of the semiconductor structures to be bonded is changed) and the method returns to a block 1735 and the processing of blocks 1735, 1740, 1745, 1750, 1755, 1760 are repeated. In one embodiment, blocks 1735 to 1756 are repeated a number of times (e.g., two or more times) until the alignment error is less than the alignment error threshold (e.g., to achieve a desired alignment accuracy).

In one embodiment, the alignment error threshold is adjustable prior to and during operation of alignment device (e.g., such a user may reconfigure the alignment error threshold after a certain number of iterations of blocks 715 and 720). Blocks 1735 to 1756 may, for example, be repeated substantially automatically (i.e., in real-time by processor 512) in some embodiments and repeated manually or semi-automatically (e.g., based upon user input in other embodiments.

Subsequent to block 1755 (i.e., subsequent to a desired alignment accuracy having been achieved), the method 1700 proceeds to a process 1701*d* at block 1760. At block 1760, the alignment device is operated to decrease the distance between the second select surface or portion of the second semiconductor structure and the second select surface or portion of the first semiconductor structure to a distance suitable for bonding. In one embodiment, the distance suitable for bonding corresponds to a distance which is substantially less than the first predetermined distance such that the surfaces of the first and second semiconductor structures are proximate to each other but not touching (i.e., not close enough to initiate bonding).

Additionally, at block 1765, an initial point of contact is formed between portions of the first and second semiconductor structures (e.g. a substantially center point on the second select surface or portion of the first semiconductor structure and a substantially center point on the second select surface or portion of the second semiconductor structure). In one embodiment, the point of contact corresponds to a location at which occurs an initial bond between the first and second semiconductor structures. The point of contact may, for example, be formed through use of the first and/or second mounting portions (e.g., 530, 540) of the alignment device in conjunction with a vacuum/pressure device or other holding structure (e.g., the vacuum/pressure device described above in conjunction with FIGS. 5 and 6) of the alignment device. For example, a vacuum/pressure device may apply a predetermined pressure (e.g., a pressure of about one pound per square inch gage (psig)) underneath the first and/or second mounting portions. The predetermined pressure, in turn, may be applied to the semiconductor structure(s) being supported by the first and/or second mounting portions (e.g., through one or more zones of vacuum rings and/or one or more zones of vacuum pressure points coupled to the mounting portions).

At block 1770, the second select surface or portion of the first semiconductor structure and the second select surface or portion of the second semiconductor structure are coupled (e.g., bonded) together through a process including bonding the semiconductor structures from surfaces (or surface zones) proximate to the point of contact to surfaces (or surface zones) distal to the point of contact.

The process is completed for a second predetermined time period such that a bonded semiconductor structure (e.g., a multi-layer semiconductor structure which includes at least two semiconductor structures) is formed. In one embodiment, the second predetermined time period is between about thirty seconds and about sixty seconds.

Subsequent to block 1770, the method 1700 proceeds from the bonding process of blocks 1760, 1765 and 1770 to a process 1701e at block 1775. At block 1775, after the second predetermined time period, the first select surface or portion of the first semiconductor structure is decoupled (e.g. un-mounted or otherwise removed) from the first mounting portion of the alignment device. Additionally, at block 1780, also after the second predetermined time period, the first select surface or portion of the second semiconductor structure is decoupled (e.g. un-mounted or otherwise removed) from the second mounting portion of the alignment device.

At block 1785, the bonded semiconductor structure is annealed at a predetermined temperature. The predetermined temperature may be an elevated temperature such that stronger covalent bonds are formed between the first and second semiconductor structures (e.g. 175° C. for a period of time of about three hours). In embodiments in which the bonded semiconductor structure includes a handle structure or substrate, for example, the handle structure (e.g., fully depleted silicon on insulator (SOI) substrate) can be removed at block 1785 by wafer grinding and exposure to Tetramethylammonium Hydroxide at about 90 degrees Celsius (C). Such may provide for removal of handle structure to an SOI buried oxide (BOX) layer of the bonded semiconductor structure. Additionally, at block 1790, electrical interconnections are formed between the first and second semiconductor structures of the bonded semiconductor structure. In one embodiment, the electrical interconnections are formed using complementary metal-oxide semiconductor (CMOS) lithography, plasma etching, and/or via filling processes.

Subsequent to block 1790, the method 1700 may end.

The method ending may, for example, be indicative of the first and second semiconductor structures (e.g., 100, 1100) having been aligned, bonded and electrically coupled to form a multi-layer semiconductor structure (e.g., 2100) including at least two semiconductor structures (e.g., 100, 1100).

In one embodiment, the method 1700 or select portions of the method 1700 may be repeated in response to a control signal (e.g., a control signal as may be provided by or to processor 512 of alignment device 600). In embodiments in which there are three or more semiconductor structures for alignment and bonding (e.g., multi-layer semiconductor structure 2200, shown in FIG. 2B), for example, method 1700 or select portions of method 1700 can be repeated a plurality of times (e.g., two, three or more times) such that each of the semiconductor structures (e.g., 100, 1100 and 200) are aligned for bonding. In some embodiments, the above-described alignment, bonding and electrical coupling processes are performed by a same device (e.g., alignment device 600, shown in FIG. 6). In other embodiments, the alignment, bonding and electrical coupling processes are performed by two or more devices (e.g., alignment device 600 and a bonding device).

In one aspect of the concepts, systems, circuits and techniques sought to be protected herein, the above-described method 1700 provides for increased accuracy in alignment and bonding of semiconductor structures (e.g., sub-micron wafer-to-wafer alignment post bond), with method 1700 calling for substantially reduced (or ideally eliminated) z-translation mis-alignment of the semiconductor structures with respect to each other as they are bonded. It should be appreciated that in some embodiments the method 1700 may include additional processes or fewer processes than that which are shown. Additionally, it should be appreciated that in some embodiments the processes may include additional blocks or fewer blocks that that which are shown.

Figure 8:
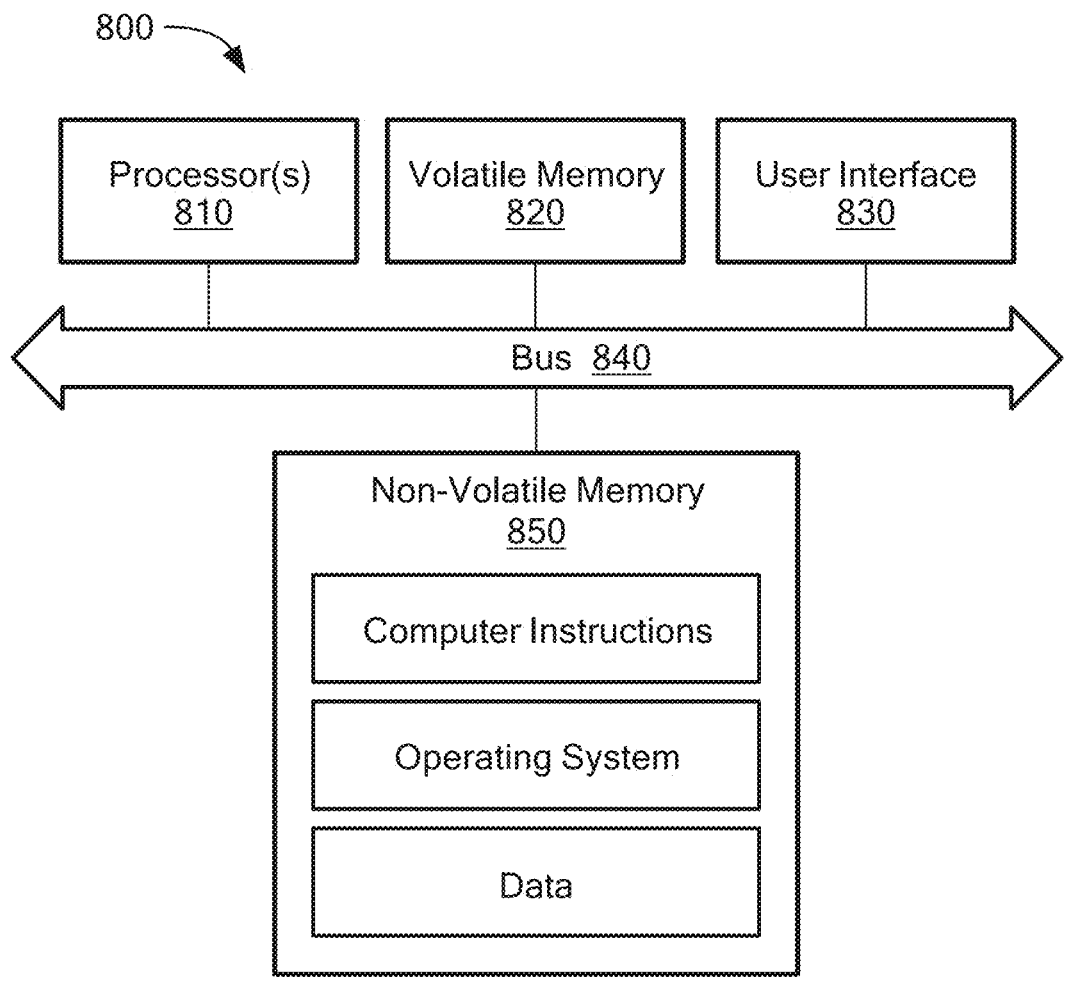
FIG. 8 is a block diagram of an example processing system on which the techniques described herein may be implemented.

Referring to FIG. 8, shown is a block diagram of an example processing system 800 that may be used to implement the example systems and associated methods discussed above in conjunction with FIGS. 1-7A.

The processing system 800 may, for example, comprise processor(s) 810, volatile memory 820, a user interface (UI) 830 (e.g., a mouse, a keyboard, a display, touch screen and so forth), non-volatile memory 850 (e.g., hard disk), each coupled to a BUS 840 (e.g., a set of cables, printed circuits, non-physical connection and so forth). The BUS 840 enables communication between the processor(s) 810, volatile memory 820, user interface (UI) 830 and non-volatile memory block 850. The non-volatile memory 850 stores computer instructions, an operating system and data. In one example, the computer instructions are executed by the processor(s) 810 out of volatile memory 820 to perform all or part of the processes described herein (e.g., methods 700 and 1700).

The processes described herein (e.g., methods 700 and 1700) are not limited to use with the hardware and software of FIG. 8; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium), for execution by, or to control the operation of, data processing apparatus (e.g., a programmable processor, a computer, or multiple computers)). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment.

A computer program may be deployed to be executed on one computer or on multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium includes but is not limited to a hard drive, compact disc, flash memory, volatile memory, magnetic diskette and so forth but does not include a transitory signal per se.

The processes described herein are also not limited to the specific examples described. For example, the processes described herein (e.g., methods 700 and 1700) are not limited to the specific processing order of FIGS. 7 and 7A. Rather, any of the processing blocks of FIGS. 7 and 7A may be re-ordered, combined or removed, performed in parallel or in serial, as necessary, to achieve the results set forth above. The processing blocks in FIGS. 7 and 7A associated with implementing the system may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., filter circuitry in mobile phones, tablets, digital cameras and the like). In contrast, the concepts, systems, circuits and techniques sought to be protected herein may be found useful in substantially any application where a semiconductor manufacturer desires to fabricate multi-layer semiconductor devices and structures including at least two semiconductor structures.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method for aligning two or more semiconductor structures to be coupled, each of the semiconductor structures having first and second opposing surfaces, one or more layers of semiconductor material disposed between the first and second surfaces, and one or more alignment marks in at least one of the layers, the method comprising:
   with a first spacing between the first and second semiconductor structures, capturing a first image of one or more alignment marks in each of the first and second semiconductor structures;
   planarizing the first and second semiconductor structures;
   changing the spacing between the first and second semiconductor structures from the first spacing to a second, different spacing;
   at the second spacing, capturing a second image of one or more alignment marks in the at least one of the first and second semiconductor structures;
   determining an alignment error value based upon a comparison of the first and second images of the alignment marks;
   in response to the alignment error being greater than a predetermined threshold value, adjusting the alignment of the first and second semiconductor structures; and
   in response to the alignment error being less than a predetermined threshold value, joining the first and second semiconductor structures.

2. The method of claim 1 wherein changing the spacing between the first and second semiconductor structures from the first spacing to a second different spacing comprises decreasing the spacing between the first and second semiconductor structures from the first spacing to the second spacing at which opposing surfaces of the first and second semiconductor structures are in physical proximity.

3. The method of claim 2, further comprising:
   at the second spacing at which opposing surfaces of the first and second semiconductor structures are in physical contact, returning to the first spacing before bonding of the first and second semiconductor structures occurs.

4. The method of claim 1 wherein joining the first and second semiconductor structures comprises bonding the first and second semiconductor structures.

5. The method of claim 1 wherein capturing a first image of one or more alignment marks in each of the first and second semiconductor structures occurs at a first point in time and capturing a second image of one or more alignment marks in the at least one of the first and second semiconductor structures occurs at a second later point in time.

6. The method of claim 5 wherein determining the alignment error comprises comparing the captured one or more alignment marks at the first time and the captured one or more alignment marks at the second time.

7. The method of claim 1 wherein adjusting the alignment of the first and second semiconductor structures comprises changing the relative positions of the first and second semiconductor structures.

8. The method of claim 7 further comprising:
with a first spacing between the first and second alignment adjusted semiconductor structures, capturing a first image of one or more alignment marks in each of the first and second alignment adjusted semiconductor structures;
planarizing the first and second alignment adjusted semiconductor structures;
changing the spacing between the first and second alignment adjusted semiconductor structures from the first spacing to a second, different spacing;
at the second spacing, capturing a second image of one or more alignment marks in the at least one of the first and second alignment adjusted semiconductor structures; and
determining an alignment error value based upon a comparison of the first and second images of the alignment marks.

9. The method of claim 1 wherein changing the spacing between the first and second semiconductor structures from the first spacing to a second, different spacing comprises initiating contact between a first surface of the first semiconductor structure and a first surface of the second semiconductor structure at an initial point of contact.

10. The method of claim 1 wherein in response to the alignment error being less than an alignment error threshold, the method further comprises initiating contact between a first surface of the first semiconductor structure and a first surface of the second semiconductor structure at an initial point of contact.

11. The method of claim 10, wherein joining the first and second semiconductor structures comprises:
creating an initial bond between the first surface of the first semiconductor structure and the first surface of the second semiconductor structure at the initial point of contact; and
bonding the first surface of the first semiconductor structure and the first surface of the second semiconductor structure to form a bonded semiconductor structure.

12. The method of claim 11 further comprising:
annealing the bonded semiconductor structure at a predetermined temperature; and
forming electrical interconnections between the first and second semiconductor structures of the bonded semiconductor structure.

13. The method of claim 12 wherein forming electrical interconnections between the first and second semiconductor structures of the bonded semiconductor structure comprises:
forming electrical interconnections between the first and second semiconductor structures of the bonded semiconductor structure using complementary metal-oxide semiconductor (CMOS) lithography, plasma etching, and/or via filling processes.

14. The method of claim 1 wherein planarizing the first and second semiconductor structures comprises:
determining a best-fit plane of the second surface of the first one of the semiconductor structures;
determining a best-fit plane of the first surface of the second one of the semiconductor structures; and
comparing the best-fit plane of the second surface of the first one of the semiconductor structures with the best-fit plane of the first surface of the second one of the semiconductor structures to determine tilt and tip errors of the second surface of the first one of the semiconductor structures with respect to the first surface of the second one of the semiconductor structures.

15. The method of claim 14 further comprising:
positioning the second surface of the first one of the semiconductor structures substantially parallel with respect to the first surface of the second one of the semiconductor structures based upon the determined tilt and tip errors.

* * * * *